United States Patent
Ramanan

(10) Patent No.: US 12,266,406 B2
(45) Date of Patent: Apr. 1, 2025

(54) NAND SENSING CIRCUIT AND TECHNIQUE FOR READ-DISTURB MITIGATION

(71) Applicant: Intel Corporation, Santa Clara, CA (US)

(72) Inventor: Narayanan Ramanan, San Jose, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 871 days.

(21) Appl. No.: 17/202,133

(22) Filed: Mar. 15, 2021

(65) Prior Publication Data

US 2022/0293193 A1 Sep. 15, 2022

(51) Int. Cl.
| G11C 11/00 | (2006.01) |
| G06F 3/06 | (2006.01) |
| G11C 16/04 | (2006.01) |
| G11C 16/24 | (2006.01) |
| G11C 16/26 | (2006.01) |
| G11C 16/34 | (2006.01) |
| G11C 11/56 | (2006.01) |

(52) U.S. Cl.
CPC ............ *G11C 16/26* (2013.01); *G06F 3/0604* (2013.01); *G06F 3/0655* (2013.01); *G06F 3/0679* (2013.01); *G11C 16/0483* (2013.01); *G11C 16/24* (2013.01); *G11C 16/3427* (2013.01); *G11C 11/5642* (2013.01); *G11C 11/5671* (2013.01)

(58) Field of Classification Search
CPC ...... G11C 16/26; G11C 16/0483; G11C 16/24; G06F 3/0604; G06F 3/0655; G06F 3/0679
See application file for complete search history.

(56) References Cited

U.S. PATENT DOCUMENTS

| 6,049,482 A * | 4/2000 | Aritome | G11C 16/10 365/185.24 |
| 8,503,248 B2 * | 8/2013 | Otsuka | G11C 16/0483 365/185.11 |
| 9,564,236 B2 * | 2/2017 | Suito | G11C 16/0483 |
| 2009/0003069 A1 | 1/2009 | Lee et al. | |

* cited by examiner

*Primary Examiner* — Pho M Luu
(74) *Attorney, Agent, or Firm* — Akona IP PC

(57) ABSTRACT

Sensing circuits and techniques for NAND memory that can enable improved read disturb on the selected SGS are described herein. In one example, a reverse sensing circuit includes circuitry coupled with a bitline of the string of NAND memory cells to perform a sensing operation. The circuitry charges the bitline of the string of NAND memory cells to a target bitline voltage and applies a voltage to the source line that is higher than the bitline voltage. The sense current flows through the string from the source line to the bitline. The voltage at a sensing node that is indicative of a threshold voltage of a memory cell can then be detected.

20 Claims, 18 Drawing Sheets

NAND SENSING CIRCUIT AND TECHNIQUE FOR READ-DISTURB MITIGATION

FIELD

The descriptions are generally related to non-volatile storage media such as NAND flash memory, and specifically to read-disturb mitigation in NAND flash memory.

BACKGROUND

Flash storage, such as NAND flash memory, is a non-volatile storage medium. Nonvolatile storage refers to storage having a state that is determinate even if power is interrupted to the device. Three dimensional (3D) NAND flash memory refers to NAND flash memory in which a NAND string may be built vertically so that field effect transistors (FETs) of the string are stacked on top of one another. 3D NAND and other 3D architectures are attractive in part due to the significantly higher bit densities that can be achieved relative to two dimensional (2D) architectures. Thus, flash storage is increasingly being used across mobile, client, and enterprise segments. In addition to the high bit density, other metrics, such as low error rate, are also desirable in storage technologies.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

Figure 1:
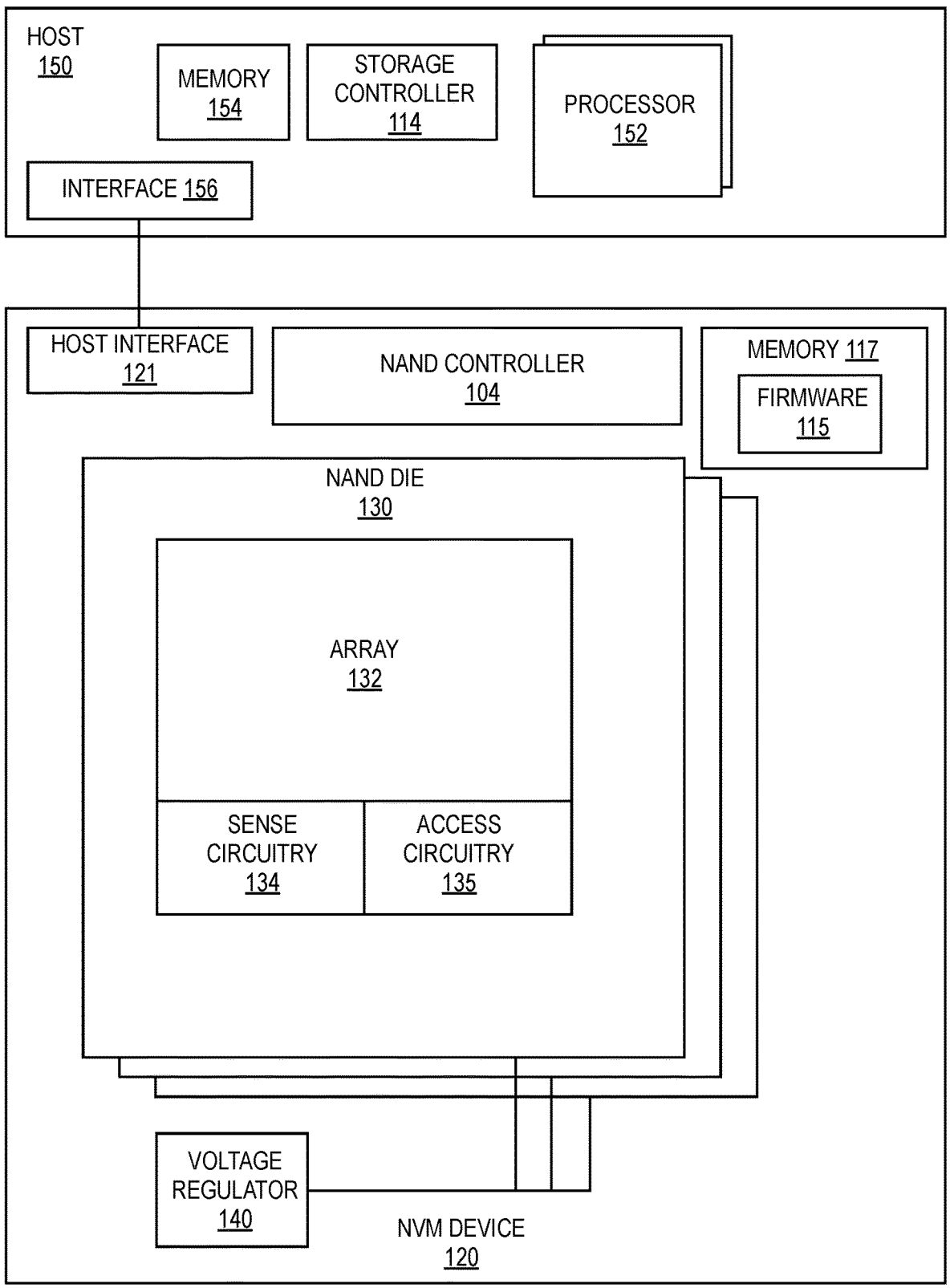
FIG. 1 is a block diagram of an example system that includes a NAND device.

Descriptions of certain details and implementations follow, including a description of the figures, which may depict some or all of the embodiments described below, as well as discussing other potential embodiments or implementations of the inventive concepts presented herein.

DETAILED DESCRIPTION

NAND sensing circuits and techniques that can enable improved read disturb are described herein.

Blocks in a 3D NAND array are typically subjected to a large number of reads, which can lead to a disturb on the cells (especially cells that have a low threshold voltage (Vt)). For example, read disturb may occur when the unselected wordlines (WLs) in the NAND string are over-driven (with high bias) to turn them on. The high field between the gate and the channel on the unselected wordlines can cause Fowler-Nordheim (FN) or trap-assisted tunneling (TAT) through the gate dielectric, leading to read disturb.

A reduction in the FN/TAT disturb can be obtained by partially boosting the sub-blocks (SBs) on the unselected-Select-Gate-Source (uSGS) during the entire duration of the read. However, the sub-blocks on the selected-Select-Gate-Source (sSGS) are resistively coupled to the source as they share the same SGS while a given sub-block is being read. Therefore, the read-disturb seen in the NAND array is typically dominated by FN disturb on sub-blocks in the selected SGS.

Reading a NAND memory cell involves sensing a voltage or current (or a change in voltage or current) through a string of NAND memory cells that is indicative of the threshold voltage of the memory cell being read. All-bit-line (ABL) sensing is one sensing technique that may be used to perform a read operation in NAND memory. ABL sensing typically involves substantially concurrent sensing in adjacent NAND strings. For example, ABL sensing may involve sensing a NAND memory cell's Vt by applying a voltage difference between the bitline and the source (where the bitline voltage>source voltage) and actively measuring the current flowing through the NAND string. In this scheme, since the channel in all the NAND strings sharing the same active SGS are connected to the source, those strings may suffer from the full impact of the (Vpass−Vsource) overdrive, leading to FN disturb.

One way to obtain a reduction in the FN/TAT disturb is by splitting the SGS into segments such that only a portion of the sub-blocks on the selected SGS are connected to the source, while the remaining sub-blocks on the uSGS can be isolated during the wordline ramp, thereby partially boosting the sub-blocks on the unselected SGS. Because the overdrive on the sub-blocks in the unselected SGS is reduced (e.g., to Vpass−Vsource−Vboost), FN/TAT disturb on the unselected SGS may also be reduced proportionally. However, these techniques fail to reduce read disturb on the sub-blocks of the selected SGS.

In contrast, a reverse sensing circuit and technique can reduce read disturb on the selected SGS. In one example, a reverse sensing circuit includes circuitry coupled with a bitline of the string of NAND memory cells to perform a sensing operation. The circuitry charges the bitline of the string of NAND memory cells to a target bitline voltage and applies a voltage to the source line that is higher than the bitline voltage. The sense current flows through the string from the source line to the bitline, which is the opposite direction compared to conventional sensing circuits. The voltage at a sensing node that is indicative of a threshold voltage of a memory cell can then be detected. The higher source voltage can enable a significant reduction in read disturb in sub-blocks on the selected SGS, which can result in improved immunity to read-related data corruption and improved SSD Quality-of-Service (QoS) (e.g., due to a reduced need to evict pages).

FIG. 1 is a block diagram of an example system that includes a NAND device. The system 100 is an example of a system that may implement sensing and read disturb mitigation techniques described herein.

The system 100 includes a host 150 and non-volatile storage or non-volatile memory (NVM) device 120. The NVM device 120 may be a solid state drive (SSD) or other non-volatile memory device or drive. The host 150 and the NVM device 120 can be an example of a system that exists within the confines of a computer's package (e.g., within a laptop/notebook, server, or other computer). In other examples, the NVM device 120 may be accessed via a larger network such as a local area network (e.g., an Ethernet network), or a wide area network (such as a wireless cellular network, the Internet, etc.). Such examples may be in compliance with a standard such as NVMe-oF (non-volatile memory express over fabrics). The host 150 includes one or more processors 152, memory 154, a storage controller 114, and other components that are omitted from the drawing for clarity.

The NVM device 120 includes one or more memory arrays 132 for storing data. The arrays 132 can be a memory or storage medium that can store one or more bits in memory cells. In one example, the arrays include strings of memory cells such as the NAND string illustrated in FIG. 2, discussed below. In one example, the NVM device 120 includes one or more non-volatile memory dies, each divided into multiple planes or groups. NAND flash memory is typically block-addressable. Typical NAND dies have multiple planes per die. A plane includes multiple memory cells which may be grouped into blocks. A block is typically the smallest erasable entity in a NAND flash die. In one example, a block includes a number of cells that are coupled to the same bitline. A block includes one or multiple pages of cells. The size of the page can vary depending on implementation. In one example, a page has a size of 16 kB. Page sizes of less or more than 16 kB are also possible (e.g., 512 B, 2 kB, 4 kB, etc.). In one example, The NVM device 120 can include memory devices that use multi-threshold level NAND flash memory. The array 132 can include single-level cell (SLC) NAND storage devices, multi-level cell (MLC) NAND storage devices, triple-level cell (TLC) NAND storage devices, quad-level cell (QLC) storage devices, penta-Level Cell (PLC), and/or some other NAND.

The NVM device 120 communicates with the host system 150 using respective interfaces 121 and 156. In one example, the interface 156 is a part of a peripheral control hub (PCH). In the example illustrated in FIG. 1, the host includes a controller 114 that is coupled with the NVM device 120 via the interface 156 to communicate with and control the NVM device 120. In the illustrated example, the NVM device 120 includes a controller 104 that is coupled with a computing platform such as the host 150 via the interface 121. In one example, the controller 104 is an ASIC (application specific integrated circuit). In one example, the interfaces are compliant with a standard such as PCI Express (PCIe), serial advanced technology attachment (ATA), a parallel ATA, universal serial bus (USB), and/or other interface protocol. The controller 104 can communicate with elements of the computing platform to read data from the NAND dies 130 or write data to the NAND dies 130. Although in this disclosure, the term "host" is referring to a system with a processor (or other device sending requests to access data stored in a non-volatile memory) and an interface for communicating with the NAND (e.g., the host 150), some implementations may refer to the controller 104 as a "host" relative to the NAND dies 130.

The controller 104 can be configured to receive requests from the host 150 and generate and perform commands concerning the access of the arrays 132 (e.g., to read data, write, or erase data). Other commands may include, for example, commands to read status, commands to change configuration settings, a reset command, etc. The controller includes control logic that can be implemented with hardware (e.g., circuitry), software, firmware, or a combination of hardware, software and firmware. Examples of logic circuitry include dedicated hardwired logic circuitry (including, e.g., one or more state machine logic circuits), programmable logic circuitry (e.g., field programmable gate array (FPGA), and a programmable logic array (PLA). In one example, logic circuitry is designed to execute some form of program code such as SSD firmware (e.g., an embedded processor, embedded controller, etc.).

The NVM device 120 may include a memory 117 coupled with the controller 104 which can be used to cache data from the non-volatile media and store firmware 115 executed by the controller 104. In one example, the memory 117 is volatile memory. Volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, originally published in September 2012 by JEDEC), DDR5 (DDR version 5, originally published in July 2020), LPDDR3 (Low Power DDR version 3, JESD209-3B, August 2013 by JEDEC), LPDDR4 (LPDDR version 4, JESD209-4, originally published by JEDEC in August 2014), LPDDR5 (LPDDR version 5, JESD209-5A, originally published by JEDEC in January 2020), WIO2 (Wide Input/Output version 2, JESD229-2 originally published by JEDEC in August 2014), HBM (High Bandwidth Memory, JESD235, originally published by JEDEC in October 2013), HBM2 (HBM version 2, JESD235C, originally published by JEDEC in January 2020), or HBM3 (HBM version 3 currently in discussion by JEDEC), or others or combinations of memory technologies, and technologies based on derivatives or extensions of such specifications. The JEDEC standards are available at www.jedec.org.

The controller 104 is coupled with the NAND dies 130 to control or command circuitry on the dies to cause operations to occur (e.g., read, program, erase, suspend, resume, and other operations). Communication between the NAND dies 130 and the controller 104 may include the writing to and/or reading from specific registers. Such registers may reside in the controller 104, on the NAND dies 130, or external to the controller 104 and the NAND dies 130. Registers or memory within the dies 130 may be reachable by the controller 104 by, e.g., an internal interface between the controller 104 and NAND dies 130 (e.g., an Open NAND Flash Interface (ONFI) interface, a proprietary interface, or other interface) to communicatively couple the controller 104 and the arrays 132. Input/output (I/O) pins and signal lines communicatively couple the controller 104 with the NAND dies 130 to enable the transmission of read and write data between the controller 104 and the NAND dies 130. The I/O pins may also be used to transmit other data, such as status information of the dies or planes of the NAND dies 130. The NAND dies can also include other pins such as command pins (e.g., command latch enable (CLE), address latch enable (ALE), chip enable (CE #), read enable (RE #), and write enable (WE #)), and power and ground pins (e.g., Vcc, Vss, etc.). The voltage regulator 140 represents circuitry to provide one or more voltages to the access circuitry 135, sense circuitry 134, and/or array 132.

The NAND die 130 includes access circuitry 135 to control access to the array 132. For example, the access circuitry 135 is to generate or apply voltages to the array 132 to perform access operations (e.g., read operations, program operations, etc.) based on commands received from the controller 104. The access circuitry on the NAND die 130 is coupled to word lines of array 132 to select one of the word lines, apply read voltages, apply program voltages combined with bit line potential levels, apply verify voltages, or apply erase voltages. The sense circuitry 134 and access circuitry 135 are coupled to bit lines of array 132 to read data stored in the memory cells, determine a state of the memory cells during a program operation, and control potential levels of the bit lines to promote or inhibit programming and erasing.

Thus, the access circuitry 135 includes circuity to generate a "read waveform," which includes voltages to apply to the array at particular times and for particular durations for performing a read operation. Similarly, the access circuitry 135 includes circuitry to generate a "program waveform," including voltages to apply to the array at particular times and for particular durations for performing a program operation. Techniques for reducing read disturb can be implemented in the access circuitry 135 and sensing circuitry 134, as explained in further detail below.

Figure 2:
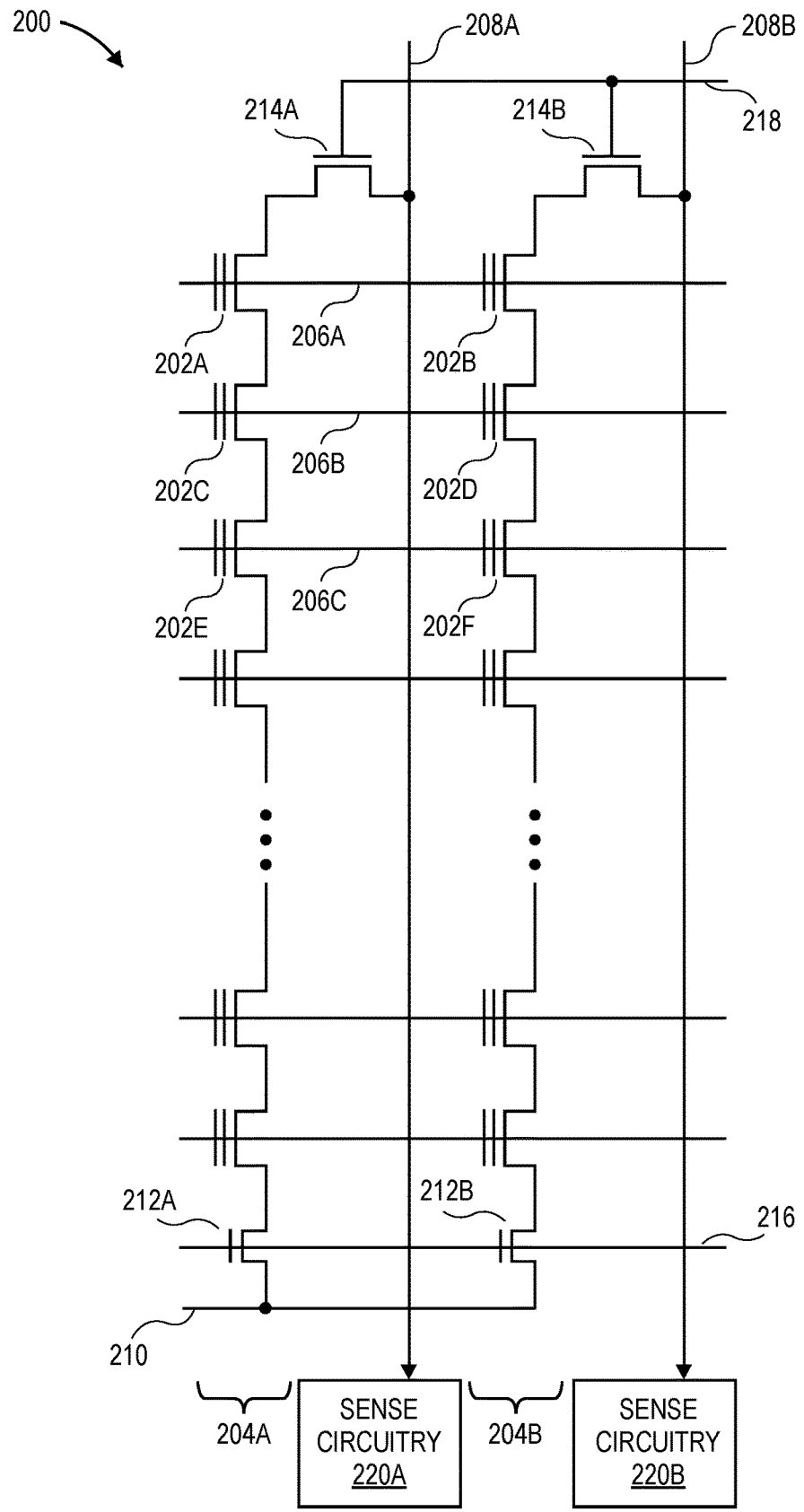
FIG. 2 depicts an example portion of a NAND flash memory array for which read disturb mitigation techniques can be implemented.

FIG. 2 depicts an example portion of a NAND flash memory array 200 for which read disturb mitigation techniques can be implemented. The NAND flash memory array 200 includes multiple non-volatile memory cells 202A-202F (abbreviated as 202) arranged in columns, such as series strings 204A and 204B (abbreviated as 204). In one example, the memory cell 202 includes a transistor with a replacement gate. A cell with a replacement gate typically has a low resistance gate (e.g., a tungsten gate) and a charge trap layer between the gate and the channel where charge is trapped or stored to represent one or more bit values. In another example, a memory cell 202 can include a transistor with a floating gate (e.g., a high resistance poly gate) that stores charge indicative of one or more bit values. Other architectures are also possible. In the series strings 204, drain regions of cells 202 are (with the exception of the top cell) coupled to a source region of another cell 202.

The array 200 also includes wordlines 206A-206C. The wordlines 206A-206C can span across multiple series strings 204 (e.g., a wordline may be coupled to one memory cell of each series string 204) and are connected to the control gates of each memory cell 202 of a row of the array 200 and used to bias the control gates of the memory cells 202 in the row. The bitlines 208A and 208B (abbreviated as 208) are each coupled to a series string 204 by a drain select gate 214 and sensing circuitry 220A and 220B that detects the state of each cell by sensing voltage or current on a particular bitline 208.

Multiple series strings 204 of the memory cells are coupled to a source line 210 by a source select gate or select-gate-source (SGS) 212A and 212B (abbreviated as 212) and to an individual bitline 208 by a drain select gate or select-gate-drain (SGD) 214A and 214B (abbreviated as 214). The source select gates 212 are controlled by a source select gate control line 216 and the drain select gates 214 are controlled by a drain select gate control line 218.

In some examples, each memory cell 202 can be programmed according to various encoding schemes such as SLC (single level cell), MLC (multi-level cell) TLC (triple level cell), QLC (quad level cell), or other encoding scheme. Each cell's threshold voltage (Vt) is indicative of the data that is stored in the cell. In one example, a cell state that is set to store multiple bits may form a part of multiple different pages, with each bit of the cell corresponding to a distinct page. For example, for a cell that is to enter a state to store 2 bits (e.g., using an MLC encoding scheme), one bit may correspond to an Upper Page (UP) and the other bit may correspond to a Lower Page (LP). For a cell that is to enter a state to store 3 bits (i.e., using a TLC encoding scheme), one bit may correspond to an LP, one bit may correspond to a UP, and the other bit may correspond to an Extra Page (XP). For a cell that is to store 4 bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may include an aggregation of corresponding bits stored by a plurality of different cells of a wordline.

In the case of a read, particular voltages are applied to the wordlines 206A-206C as well as select gates. The respective charges stored in the cells that are coupled to the activated word line influence the potential on their respective columns (e.g., "channels") and bit lines which are then sensed with sense circuitry (e.g., the sense circuitry 220A or 220B) to determine the read information (the cells that are not coupled to the activated word line are electrically isolated from their respective columns). A typical sense operation includes pre-charging the bit lines coupled to memory cells selected to be read to a predetermined voltage. As mentioned above, one sensing technique is "all bitline" (ABL) sensing. In one example, ABL sensing involves sensing of storage elements in adjacent NAND strings substantially concurrently. Typically, the direction of the sense current is from the bitline to the source line. However, as described in more detail below, increasing the source line to a higher potential than the bitline and reversing the direction of the sense current can significantly raise the channel potential in the sub-blocks of the selected SGS that are not participating in the sensing. This can dramatically reduce the read-disturb from FN or TAT. This technique may also be used for other bitline sensing schemes, such as odd/even bitline sensing, or other bitlines sensing schemes.

Figure 3:
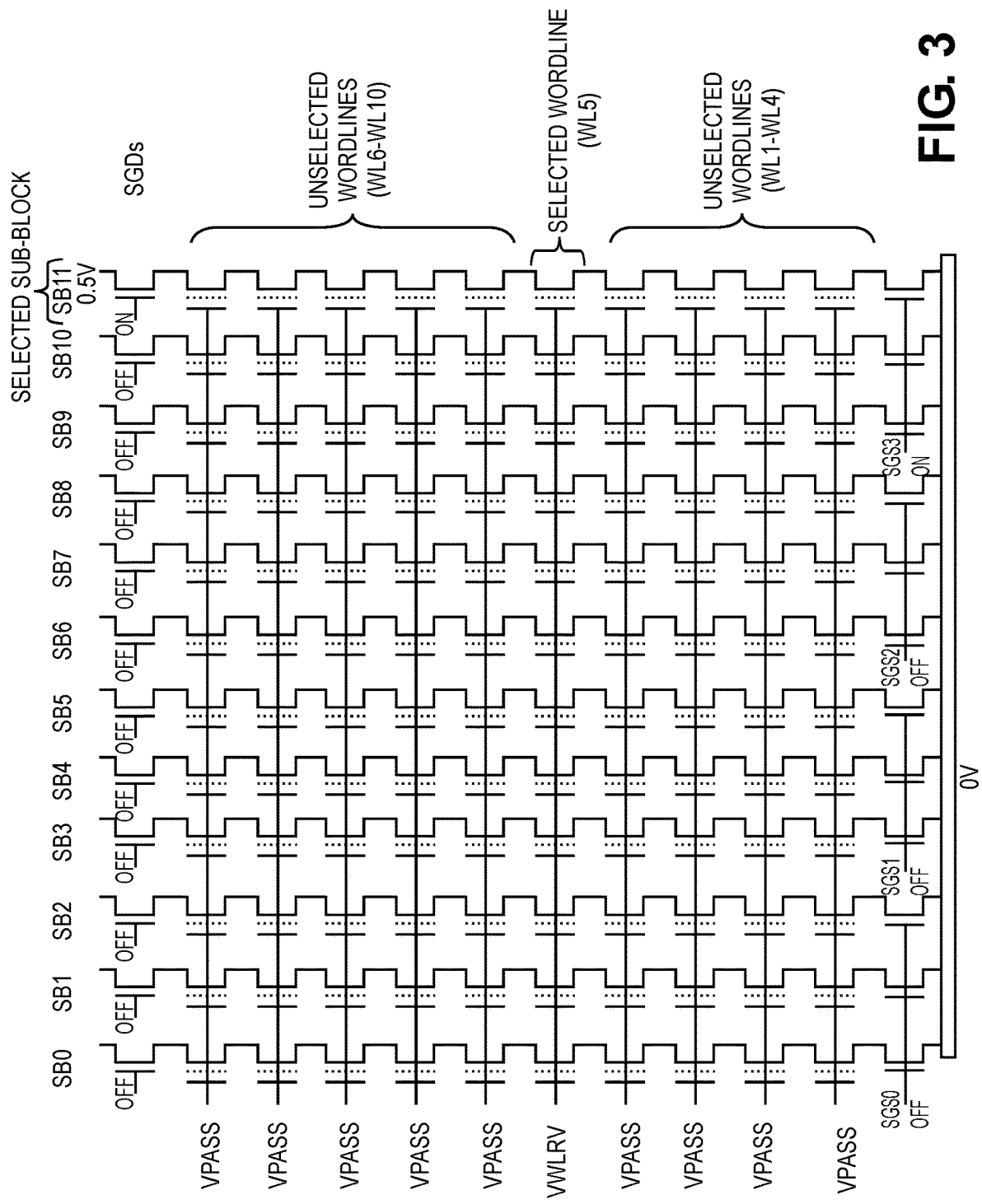
FIG. 3 illustrates an example of a portion of a NAND array in a read scenario.

FIG. 3 illustrates an example of a portion of a NAND array in a read scenario. In the example illustrated in FIG. 3, there are twelve sub-blocks (SB0-SB11), ten word lines (WL1-WL10), and four SGS groups (SGS0, SGS1, SGS2, and SGS3). In the illustrated example, wordline 5 (WL5), sub-block 11 (SB11) on SGS3 is being read. In order to read a particular wordline and sub-block, typically all the wordlines and select gates are ramped up partially to overdrive the wordlines and select gates. The unselected SGS and SGD on unselected SGS are then turned off, floating the pillars for the unselected SGS. The selected wordline (WL5) is then ramped down towards the target read voltage (VWLRV) and the unselected wordlines (WL0-WL4 and WL6-WL9) finish the ramp to the target VPASS voltage, which causes the unselected pillars to be boosted. In one example, the VPASS voltage is a high voltage that is greater than VTmax (the maximum expected threshold voltage).

The SGDs on the unselected sub-blocks of the selected SGS are turned off to prevent them from supplying current during the read operation. The target pillars can then be sensed.

Figure 4:
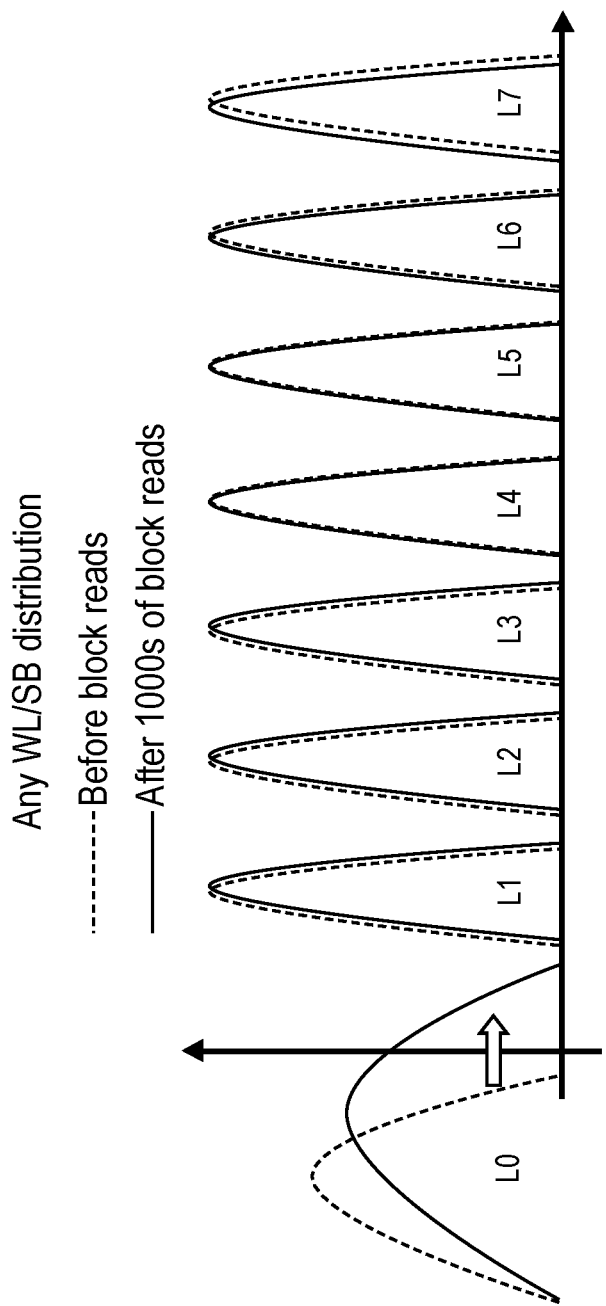
FIG. 4 illustrates an example of threshold voltage distributions before and after FN disturb.

Thus, as part of the read operation, the access circuitry typically overdrives the unselected wordlines to a high enough bias to fully turn them on and allow the bitline/source bias to pass unhindered to the target cell. The act of overdriving the unselected wordlines can create a weak field across the tunnel oxide on all the unselected WLs, which can be sufficient to cause a weak-programming via Fowler Nordheim tunneling. The accumulation of thousands of such reads over the entire array (e.g., block) may result in significant read disturb. For example, FIG. 4 illustrates an example of threshold voltage distributions before and after FN disturb. FIG. 4 illustrates threshold voltage distributions for levels L0-L7 for a triple-level cell (TLC) NAND array that stores three bits per cell. The dotted lines show the distributions before block reads, and the solid lines show the distributions after thousands of block reads. As can be seen in FIG. 4, level 0 (L0) experiences the most significant shift in threshold voltage distribution.

One effective way to reduce the amount of disturb seen on the unselected wordlines is to float the pillars that do not need to be on during the wordline-ramp phase of a given read. This way, the channel on these pillars couples fully to the wordline bias that is ramping up and reduces the wordline-to-channel (and floating gate to channel) electric field, directly reducing the FN disturb. For example, referring to FIG. 3, the SGS has been split into four segments such that SB0-SB8 can be floated during the ramp when reading a sub-block in SB9-11. The precise timing at which the pillars are floated determines the amount of boost achieved on the unselected pillars and can be optimized to minimize the FN disturb. For example, if the SGS and SGD are turned off when the wordlines reach an intermediate voltage that is less than VPASS, the remaining voltage of wordline ramp gets transferred to the channel as a boost, thereby reducing the wordline-channel potential difference.

Some read disturb mitigation techniques focus on dividing sub-blocks into as many groups as possible and boosting those sub-blocks; however, those techniques fail to address the read disturb on the sub-blocks of the sSGS (selected SGS).

In contrast, read disturb in the sub-blocks of the selected SGS can be reduced by biasing the source higher, which leads to a lower unselected-wordline overdrive. To prevent the higher source bias from affecting the threshold voltage Vt of the sensed cell on the selected sub-block via series resistance modulation, the bitline bias is reduced with respect to the source. Thus, the direction of the sensed current is switched or reversed compared to conventional sensing circuits, while maintaining sensed Vt equivalence.

Figure 5:
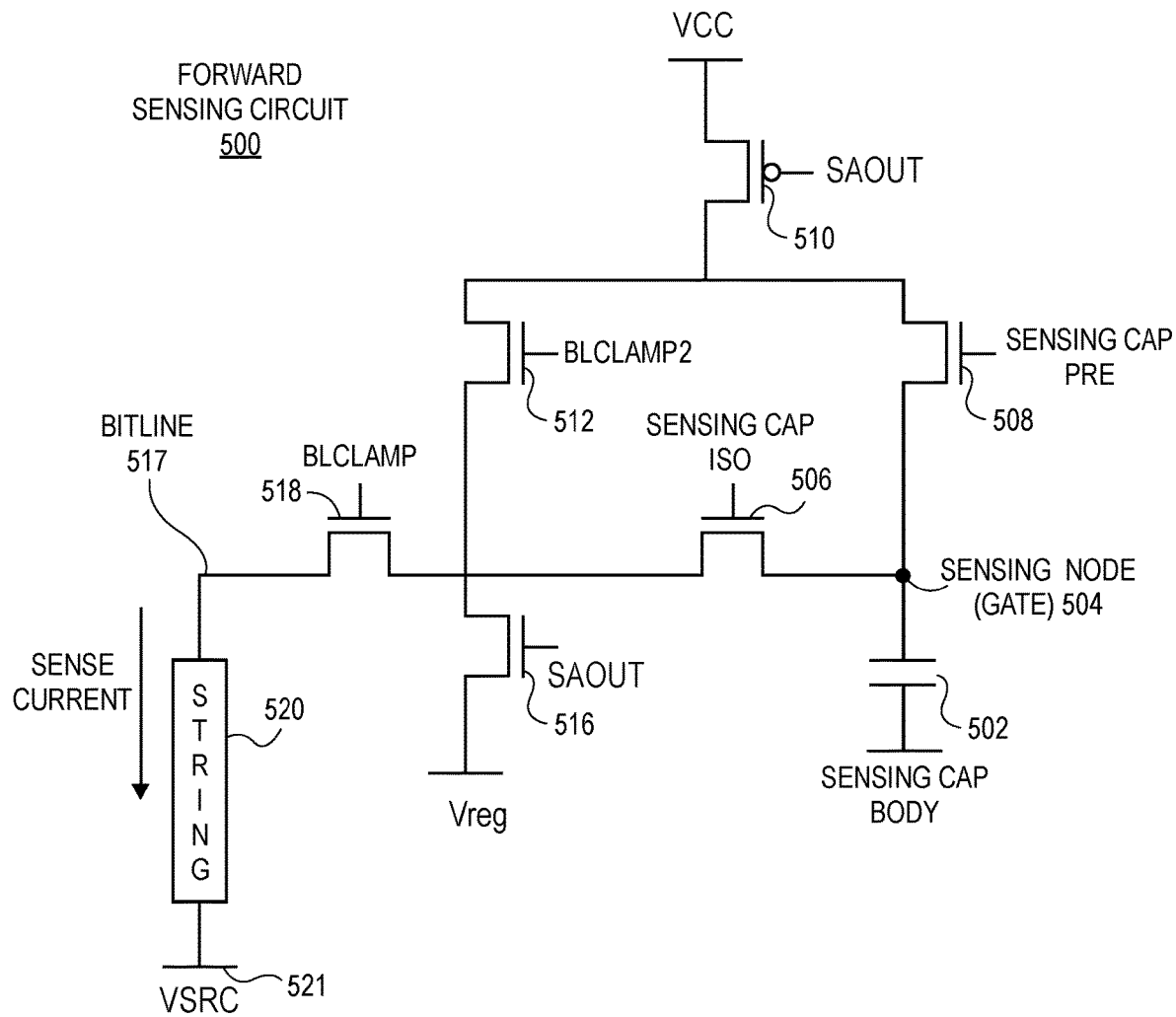
FIG. 5 is an example of a forward sensing circuit.
Figure 6:
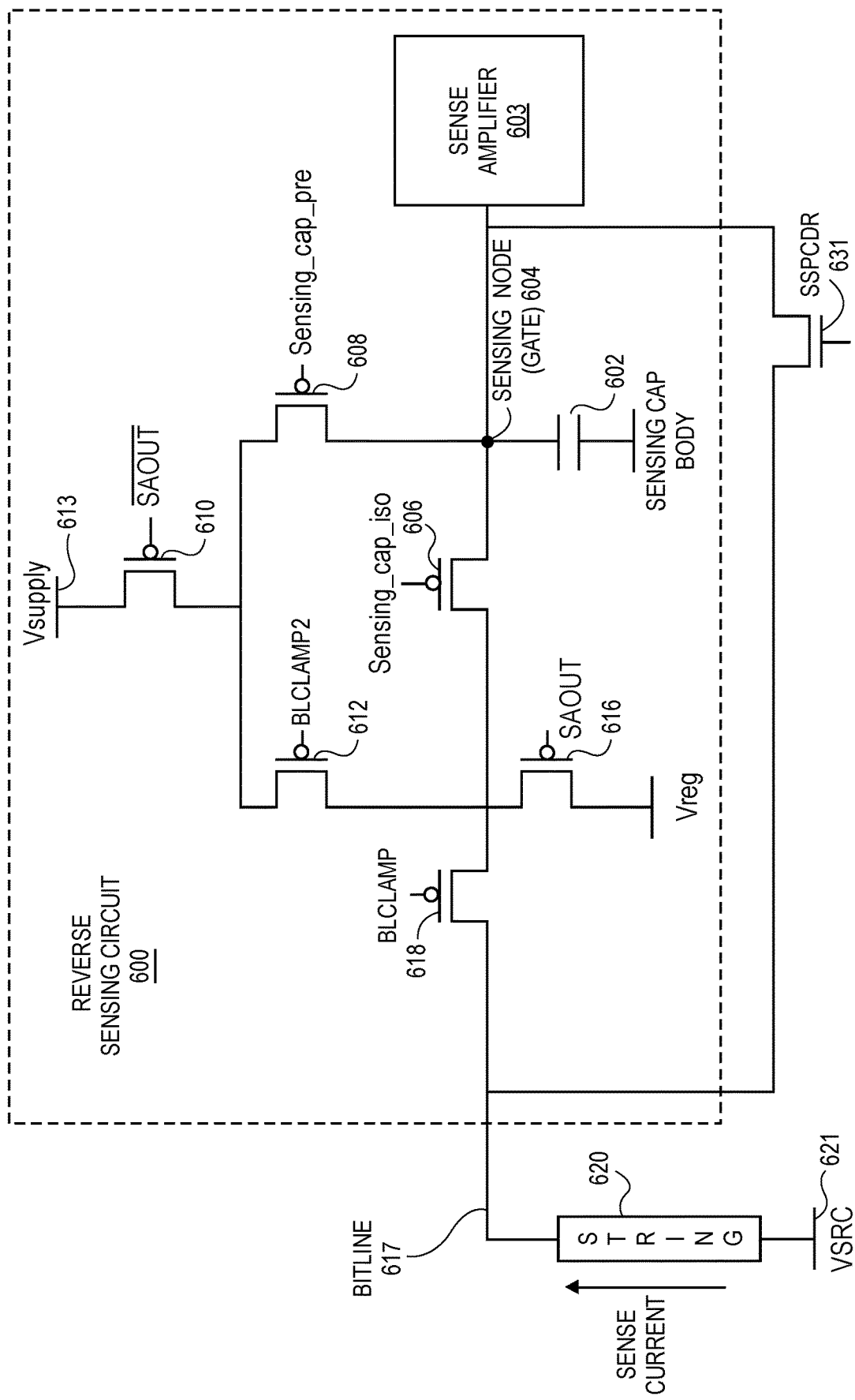
FIG. 6 is an example of a reverse sensing circuit.

FIGS. 5 and 6 illustrate examples of sensing circuits for sensing the threshold voltage of a NAND memory cell to determine the state stored in the cell. The sensing circuits of FIGS. 5 and 6 are examples of the sensing circuitry 134 of FIG. 1. FIG. 5 is an example of a forward sensing circuit. FIG. 6 is an example of a reverse sensing circuit.

Turning first to FIG. 5, the forward sensing circuit 500 includes a string 520 of NAND memory cells between a source line 521 and a bitline 517. NMOS transistors 518, 512, 510, 516, 506, 502, and 508 are coupled with the bitline 517 of the string. A source voltage is applied to the source line 521 that is lower than the voltage of the bitline 517. Thus, the sense current flows from the bitline into the string to the source line 521. The gate of an NMOS transistor 502 operating as a capacitor is initially charged to a precharge value. The transistor 506 is then turned on to allow sense current to flow from the bitline to the source, discharging the sensing node 504. Thus, Vt sensing is accomplished by discharging of the sending node with the cell current. The sensing node 504 drives a sense amplifier, which flips its output voltage when the input voltage is beyond a fixed threshold.

In contrast, FIG. 6 illustrates a sensing circuit for reverse sensing. Compared to the sensing circuit of FIG. 5, the sensing circuit 600 of FIG. 6 includes PMOS transistors instead of NMOS transistors, with the exception of an extra NMOS transistor labeled SSPCDR (selective slow program control driver).

In the illustrated example, a string 620 of NAND memory cells is coupled with a source line 621. For simplicity, a single string of NAND memory cells is depicted; however, a NAND array includes many strings of NAND memory cells. A voltage VSRC is applied to the source line 621. Circuitry 600 to perform a sensing operation is coupled with the bitline 617 of the string 620 of NAND memory cells. Unlike in forward sensing, the voltage applied to the source line is higher than the bitline voltage. Increasing the source voltage to be higher (e.g., more positive) relative to the bitline voltage can reduce the field seen by the sub-blocks of the selected SGS, which can reduce the read disturb on the selected SGS. Increasing the source voltage to be higher than the bitline voltage reverses the direction of the sense current and can affect the voltages and the current flow at different nodes in the sensing circuit. Accordingly, the transistors of the sensing circuit 600 of FIG. 6 are PMOS transistors operated to allow current to flow into the sensing circuit.

The PMOS transistors 610, 612, 618, 608, 616, and 606 control the flow of current during the sensing operation. For example, the PMOS transistors 610, 612, and 618 between the bitline and the supply are turned on to charge up the bitline 617 to a predetermined voltage prior to sensing. The transistors 618 and 612 operate to "clamp" nodes between the bitline and the supply to particular voltages. The PMOS transistors 610 and 608 between the supply and the sensing node are turned on to precharge the sensing node 604 to a predetermined voltage (which may be the same or different predetermined voltage as the bitline voltage). In one example, the transistor 616 provides a path to apply a inhibit voltage to the bitline 617 during an inhibit operation. The transistor 606 is turned on to enable current to flow from the string 620 to the sensing node 604 and turned off to isolate the sensing node 604 (e.g., in preparation for sensing the voltage at the sensing node 604).

Sensing (e.g., threshold voltage (Vt) sensing) is accomplished by charging or discharging of the sensing node 604 with the cell current. The sensing node 604 is the node at which sensing is performed to determine the state of the cell being read. Current from the string flows into or out of the sensing node 604 to change the voltage at the node. In one example, the sensing node 604 is the node at the gate of the PMOS transistor 602 operating in accumulation mode/cutoff region (close to an ideal capacitor). The voltage is then detected at the gate of the PMOS transistor 602 (e.g., at the sensing node 604). The sensing node 604 drives the sense amplifier 603. The output of the sense amplifier is based on the voltage sensed at the sense node 604. In one example, the sense amplifier 603 flips its output voltage when the input voltage is beyond a fixed threshold. In one example, compared to the forward sensing circuit 500 of FIG. 5, the definition of 0 and 1 are reversed because the same low Vt cell which passes high current would discharge the sensing node 604 below the threshold in forward sensing, while it would charge up the sensing node above the threshold in reverse sensing.

The transistor 631 is between the sensing node 604 and the bitline 617. The transistor 631 has the opposite "type" (e.g., NMOS or PMOS) compared to the transistors 610, 612, 618, 608, 616, and 606 used to control current flow during the sensing operation. For example, the transistor 631 is an NMOS transistor, and the transistors 610, 612, 618, 608, 616, and 606 are PMOS transistors. The NMOS transistor 631 is turned off during sensing operations. In one example, the NMOS transistor 631 provides a path around the PMOS transistors of the sensing circuit 600 to pass voltages to the bitline 617 during a program operation.

Figure 7A:
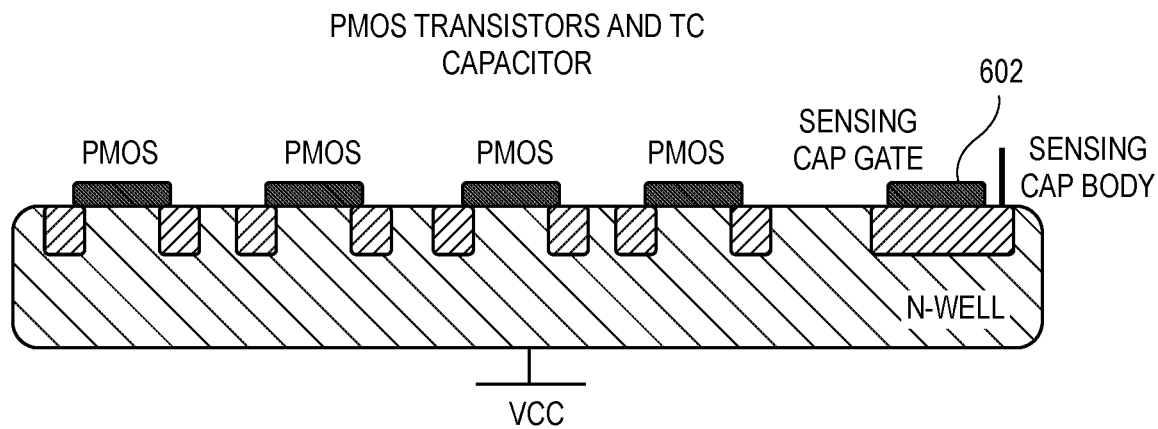
FIG. 7A illustrates an example of the sensing node of FIG. 6 as a capacitor in the N-well of PMOS transistors.

Referring again to the sensing node 604 of FIG. 6, the device at the sensing node 604 is shown in as a capacitor 602. However, in one example, the device at the sensing node 604 is a PMOS device operating close to an ideal capacitor. In one example, the device 602 always operates in accumulation. This contrasts with the forward sensing techniques. In one example of a forward sensing circuit, the— sensing node is an NMOS device with a tied source-drain always operating in inversion. In one such example, as illustrated in FIG. 7A, the capacitor 602 is fabricated as a capacitor over a heavily p-doped region in the N-well of nearby PMOS transistors (for example, the transistors 610, 612, 618, 608, 616, and 606) used for the sensing.

Figure 7B:
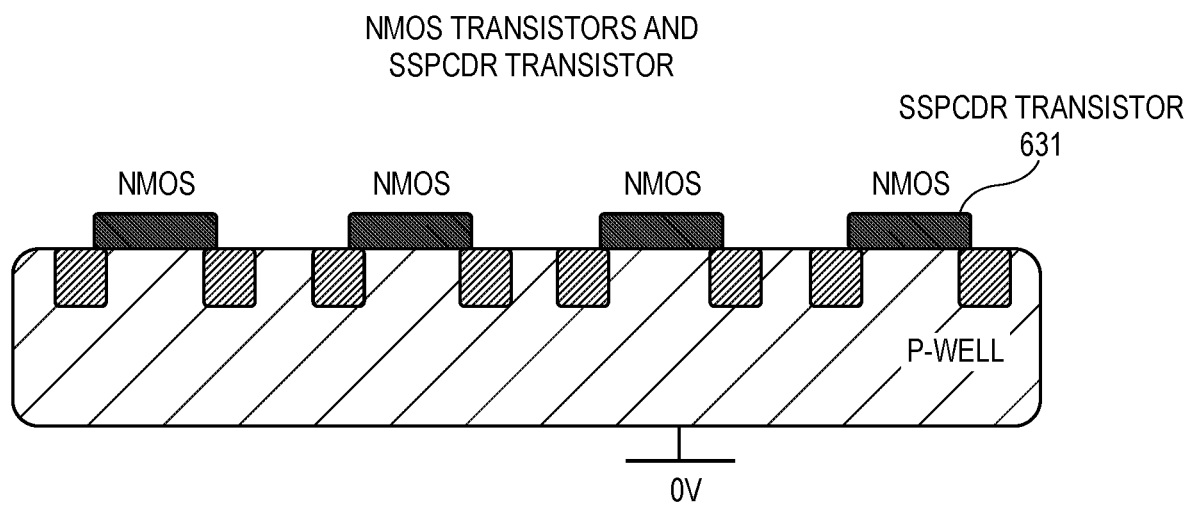
FIG. 7B illustrates an example of the SSPCDR transistor of FIG. 6 in the P-well of other NMOS transistors.

As mentioned briefly above, the reverse sensing circuit 600 of FIG. 6 also differs from the forward sensing circuit 500 of FIG. 5 in that an additional transistor 631 is coupled with the reverse sensing circuity 600 to enable program, SSPC, and inhibit operations. As illustrated in FIG. 7B, the SSPCDR transistor 631 can be accommodated in the P-well of other NMOS transistors in the sensing or access circuitry.

Thus, the reverse sensing circuit 600 of FIG. 6 includes six PMOS transistors coupled with the bitline of the string 620 of NAND memory cells. An additional NMOS transistor 631 is coupled with the bitline and the sensing node 604 to enable program, SSPC, and inhibit operations. The PMOS transistors are turned on and off by applying appropriate voltages to the source line and nodes of the transistors to perform the sensing operation, enabling a path for current to flow from the source to the bitline to charge the sensing node, which is the opposite direction compared to a forward sensing circuit. The voltage applied to the source line 621 is higher than the voltage at the bitline. The higher source line voltage results in a lower field on the sub-blocks in the selected SGS, which in turn results in an improvement in read disturb in the selected SGS.

FIGS. 8A-8F illustrate examples of a reverse sensing circuit at different times during a sensing operation (e.g., sensing for a read/verify operation). The circuit shown in FIGS. 8A-8F can be the same as, or similar to, the circuit 600 of FIG. 6. Note that in FIGS. 8A-8F, the SSPCDR transistor (e.g., the transistor 602 of FIG. 6) is turned off with 0V at its gate so that the transistor does not participate in the sensing operation. Therefore, for simplicity, the SSPCDR transistor is not shown in FIGS. 8A-8F. Also, for simplicity, the sense amplifier coupled with the sensing node (e.g., sense amplifier 603) is not shown in FIGS. 8A-8F.

Figure 8A:
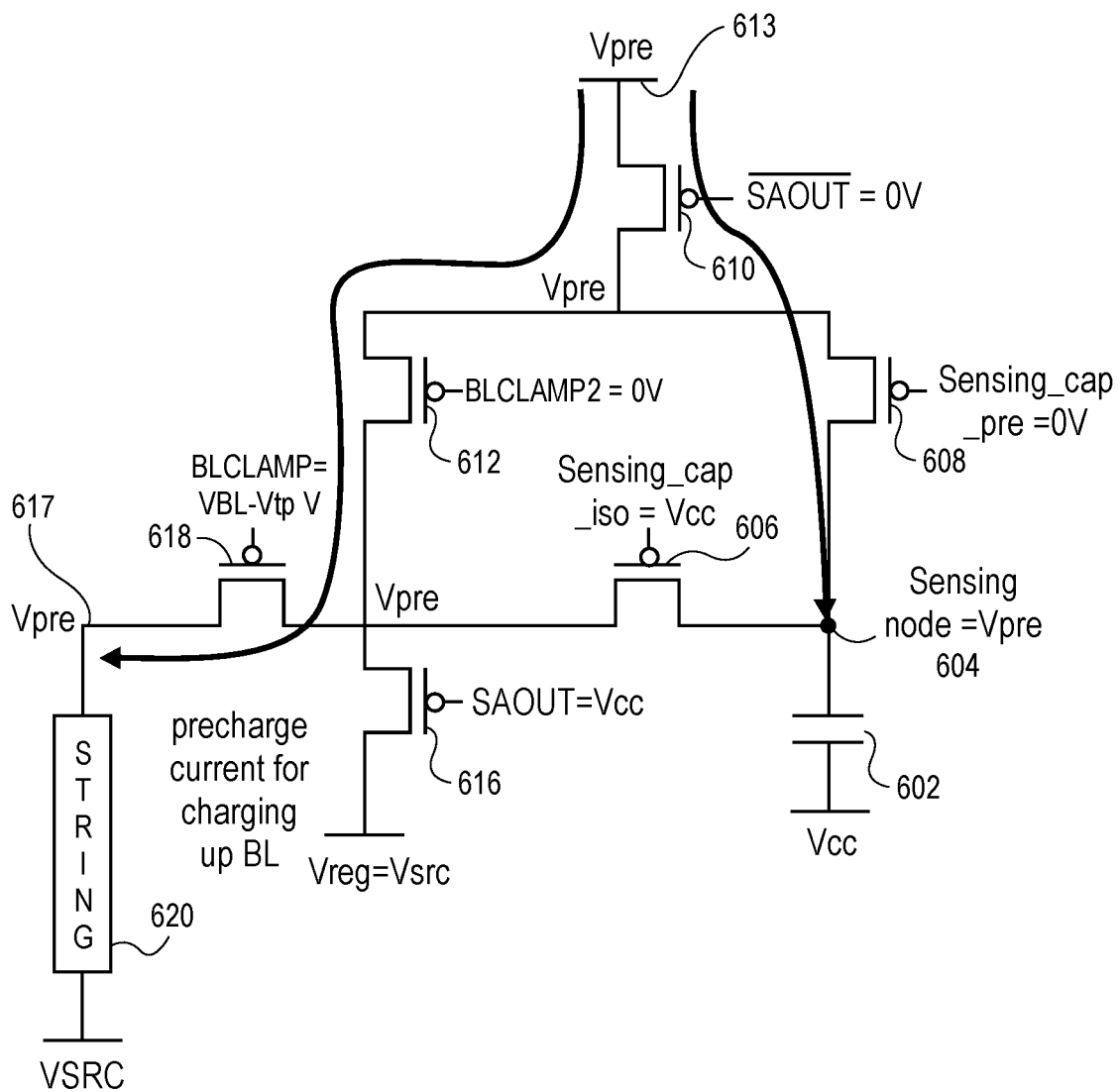
FIGS. 8A-8F illustrate examples of a reverse sensing circuit during different times during a sensing operation.

FIG. 8A illustrates an example of the reverse sensing circuit during bitline and sensing node initialization. Sensing node and bitline initialization involves initializing the bitlines 617 and the sensing node 604 to a predetermined voltage, Vpre. In the example of FIG. 8A, the voltage Vpre is provided at the Vsupply node 613. The PMOS transistors 610, 608, 612, and 618 are biased to enable a current path from the supply 613 to the string 620 and from the supply node 613 to the sensing node 604. For example, 0V is applied to the gate of the transistors 610, 608, and 612 to turn on the transistors. A voltage VBL-Vtp (where VBL is the target bitline voltage for sensing and Vtp is the threshold voltage of the transistor 618) is applied to the gate of the transistor 618 to turn on the transistor 618. Thus, the bitlines are driven through transistors 610, 612, and 618 and the sensing node 604 is driven through the transistors 610 and 608. In the illustrated example, during the bitline initialization, the transistors 606 and 616 are off. Thus, the gates of the transistors 606 and 616 are driven with a sufficiently positive voltage (e.g., VCC or some other positive voltage) to turn off the transistors 606 and 616.

Figure 8B:
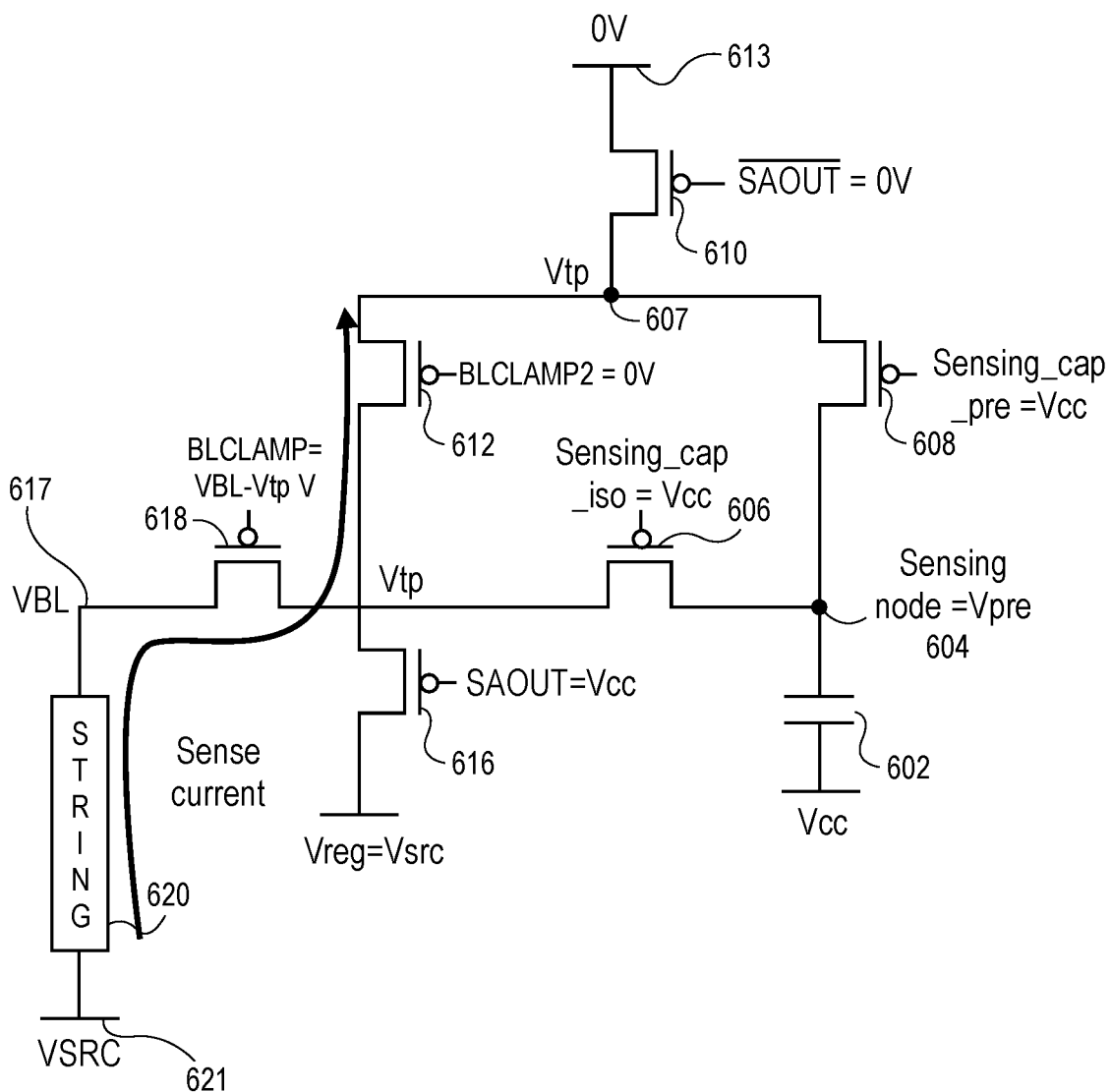

After initializing the bitline and the sensing node to a predetermined voltage, the bitlines stabilize to a target bitline voltage, as shown in FIG. 8B. In the example shown in FIG. 8B, the sensing node 604 is isolated by turning off the transistor 608 and Vsupply is grounded to allow for the bitlines to discharge and stabilize close to the target bitline voltage VBL. For example, a voltage (e.g., VCC) is applied to the gate of the transistor 608 between the supply voltage Vsupply and the sensing node 604 to turn off the transistor 608. The bitline voltage at the bitline 617 is based on the voltage applied to the gate of the transistor 618 and the current provided by the sensed string passing between the bitline 617 and the supply node 613. In the example illustrated in FIG. 8B, a voltage equal to VBL−Vtp is applied to the gate of the transistor 618, where Vtp is the threshold voltage of the PMOS transistor 618 and VBL is the target bitline voltage. The nodes 605 and 607 between the supply voltage and the bitline are clamped at Vtp (the threshold voltage of the PMOS transistors). In one example, the string current drawn from the source 621 through the string 620 is matched to the string current into the source in a forward sensing scheme. Thus, the supply voltage is switched from an initial voltage Vpre to 0V (ground), causing the bitline voltage to go to the target bitline voltage VBL based on the voltage applied to the gate of the transistor 618. The supply and transistor gate voltages are maintained at these levels to allow time for bitline stabilization.

Figure 8C:
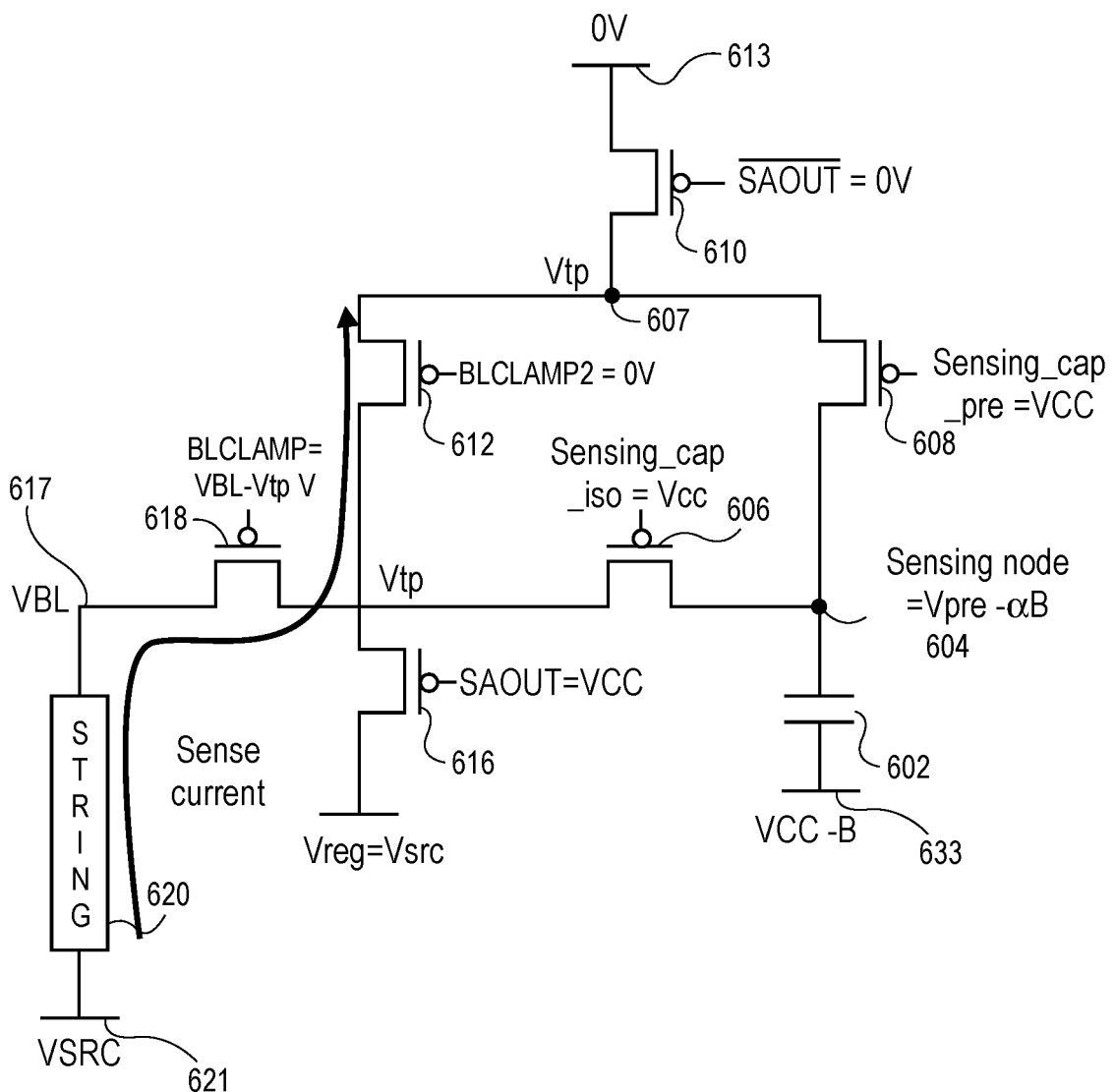

After the bitline stabilizes, the isolated sensing node is boosted down, as shown in FIG. 8C. "Boosting down" the sensing node 604 involves swinging down the voltage at another node (e.g., from a positive voltage to 0V or to a lower magnitude positive voltage), to cause the node of interest to also swing down. For example, the body 633 is pulled down by "B" V, which couples to the gate node 604, causing the gate (sensing) node to decrease by αB V, where α is the coupling ratio, which is less than 1. After boosting down the voltage by B V, the voltage at the sensing node 604 is equal to VPre-αB. Decreasing or boosting down the sensing node voltage enables a lower starting voltage at the sensing node prior to sensing to increase the margin for charging up the sensing node 604 during sensing.

Figure 8D:
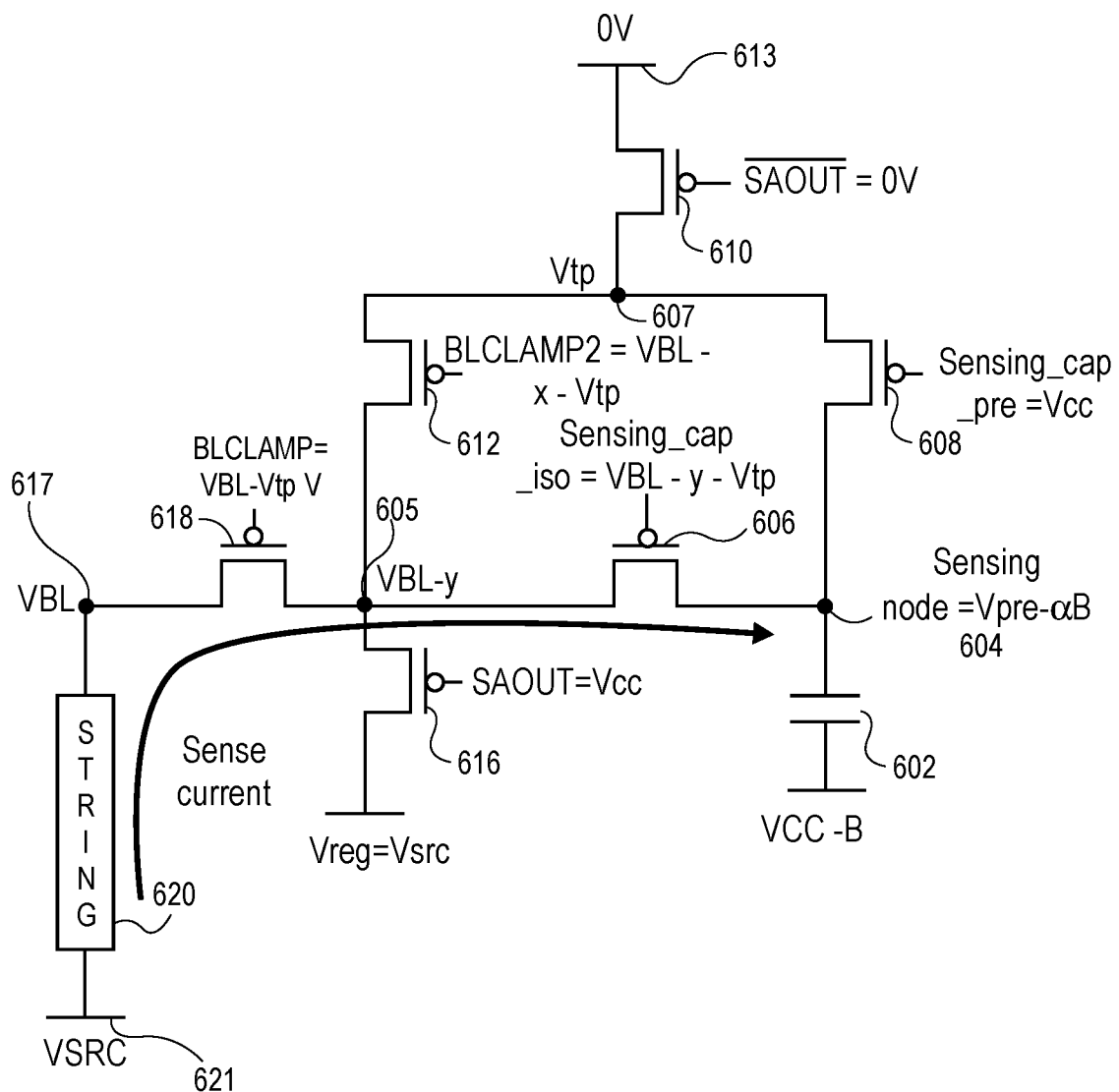

After boosting down the sensing node 604, a path between the bitline and the sensing node is enabled to allow current to flow from the source line through the bitline to the gate of the PMOS transistor at the sensing node 604 for a predetermined time, as is shown in FIG. 8D. In the example illustrated in FIG. 8D, the transistors 606 and 612 are initially off. For example, voltages are applied to the gate of the transistor 606 (e.g., VBL−y−Vtp) and the gate of the transistor 612 (e.g., VBL−x−Vtp) such that the transistors are initially off. The transistor 606 overdrive (gate to source voltage) is set such that the transistor turns on when the node 605 is greater than or equal to a particular value (e.g., >=VBL−y V). The transistor 612 overdrive is set such that the transistor 612 is off initially (e.g., when the node 605 is <VBL−x) and turns on when the node 605 is greater than or equal to a predetermined voltage (e.g., >=VBL−x).

In the illustrated example, the voltage VBL−Vtp is applied to the gate of the transistor 618, allowing current to flow from the string 620 to the node 605, causing the voltage at the node 605 to increase. Thus, the string starts to supply current to raise the node 605 up from Vtp. When the node 605 reaches VBL−y V, the transistor 606 turns on and current flows into the gate of the transistor 602 at the sensing node 604. The current is allowed to flow from the source line 621 through the bitline to the gate of the PMOS transistor 602 at the sensing node 604 for a predetermined time.

Figure 8E:
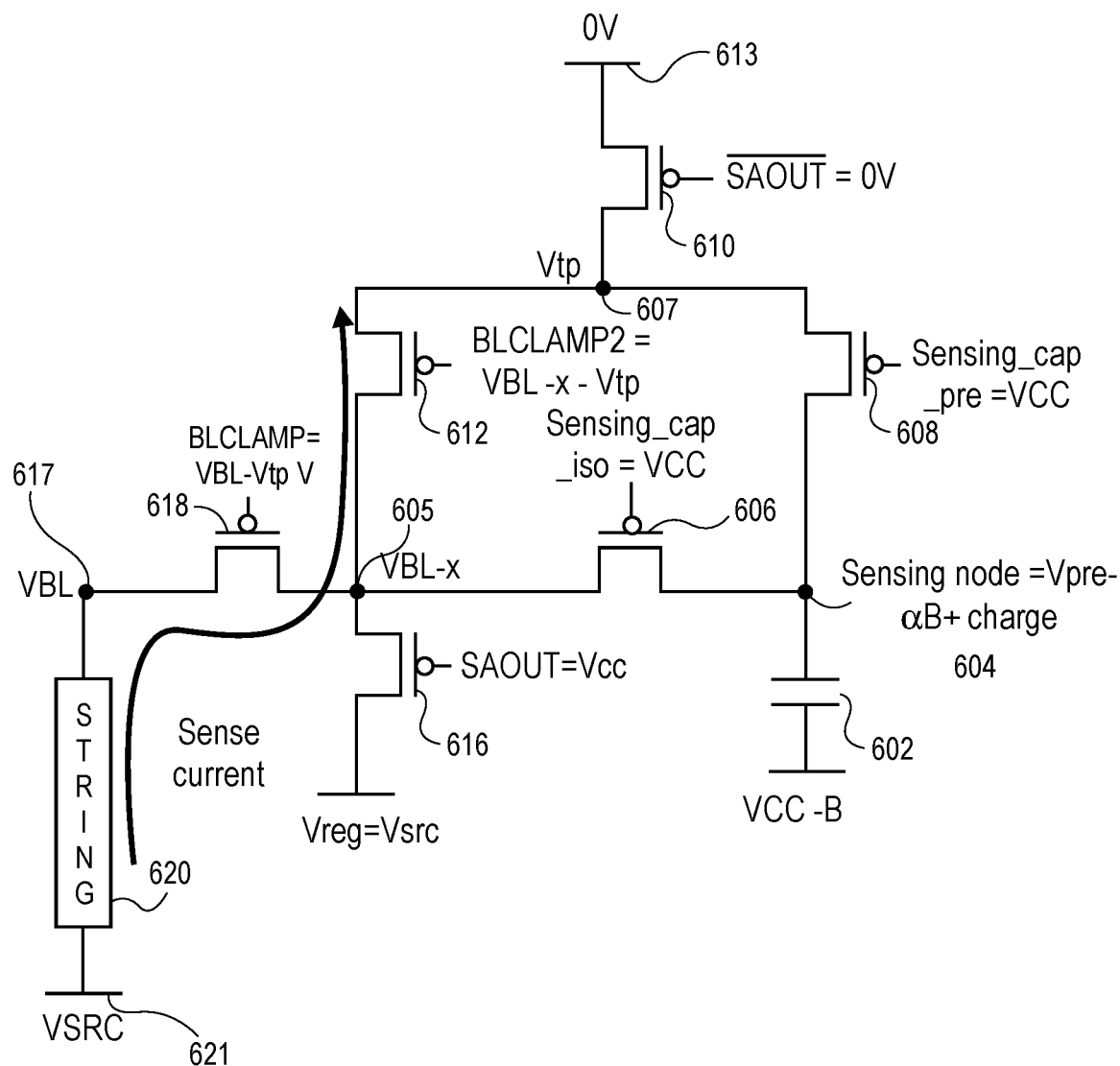
Figure 8F:
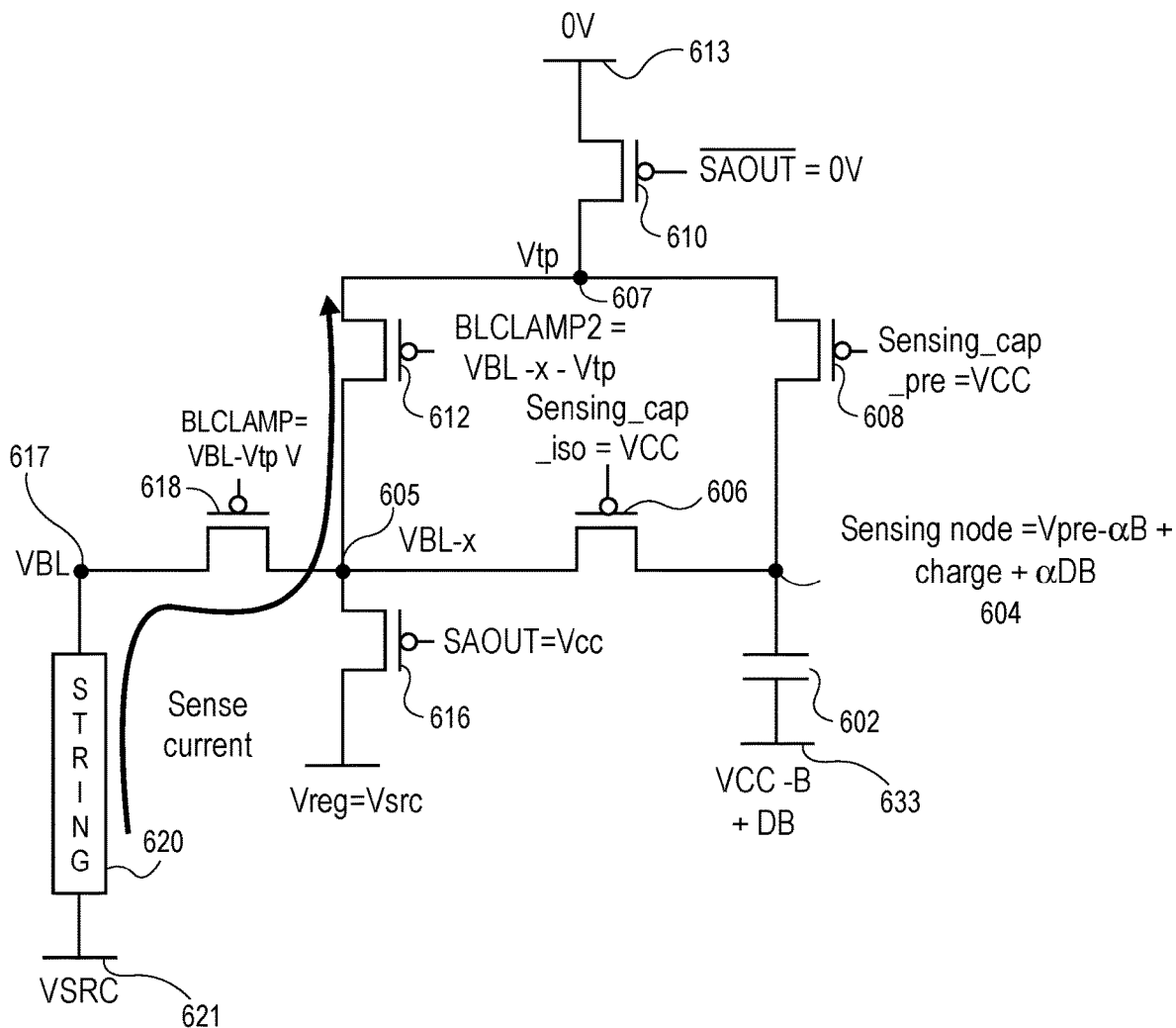

After the current has flowed from the source through the string and bitline to the sensing node 604 for the predetermined time, charge has accumulated in the sensing node 604, and the current path can be turned off by turning off the transistor 606, as shown in FIG. 8E. Once the transistor 606 is explicitly turned off, the sensing node 604 at the gate of the transistor 602 is isolated. Once the sensing node 604 is isolated, the string current drives the node 605 above a voltage (e.g., VBL−x) and turns on the transistor 612. Subsequently, the string current flows through the transistor 612 to ground (GND) and the node 605 is clamped to VBL−x V. Thus, after the charge has accumulated in the sensing node 604, the voltage at the sensing node represents or is indicative of the Vt of the cell that is being read. The voltage at the sensing node is indicative of the accumulated charge corresponding to the current flowing from the source to the bitline over the predetermined time. In one example, once the voltage at the sensing node has been detected, the sensing operation is complete.

After the sensing operation is complete, the sensing node can be "deboosted" and strobed to sense the Vt of a second cell having a different Vt. Consider an example in which there are two different cells at two different threshold voltages. In this example, current was allowed to flow for both of these cells prior to sensing (e.g., see FIG. 8D in which current flowing from source to bitline through the string charged up the sensing node). The charge at the sensing node would be based on the Vt of both of the cells (e.g., based on the current flowing through both cells for the predetermined time the current was flowing). By changing the voltage at the sensing node 604 (e.g., "deboosting" the sensing node 604), the voltage at the sensing node corresponding to the second cell can be sensed. Deboosting can involve, for example, increasing the voltage applied to the body of the transistor 602 by DB V. Thus, in the example illustrated in FIG. 8F, the voltage applied to the body of the transistor 602 is VCC−αB+DB V. The increase of DB V couples to gate of the transistor 602 at the sensing node 604. In one example, DB V is selected to cause the sensing node to reach the threshold necessary to flip the sense amplifier for the target sense current.

Figure 9A:
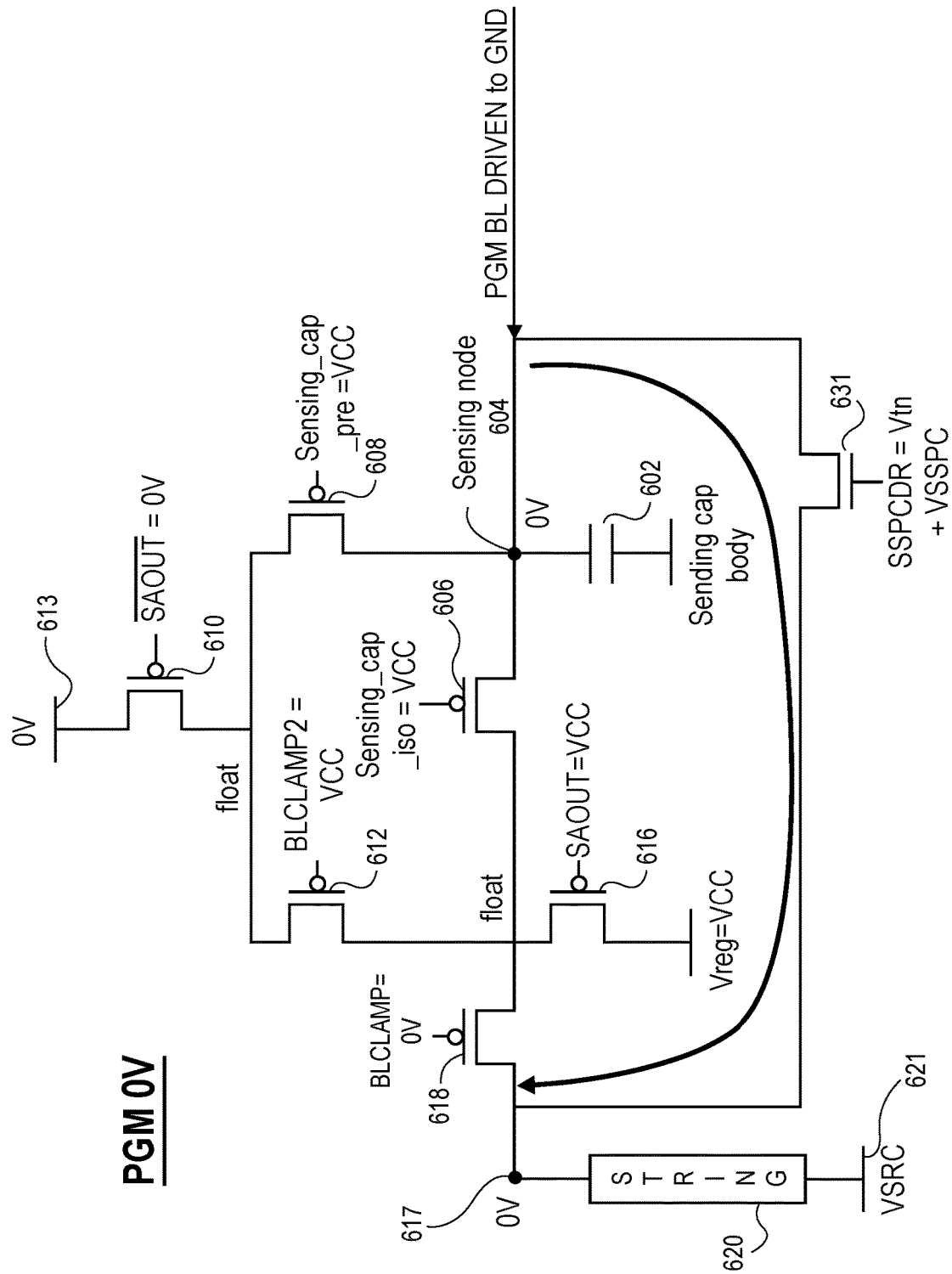
FIGS. 9A-9C illustrate examples of a reverse sensing circuit during program, program SSPC, and inhibit operations, respectively.
Figure 9B:
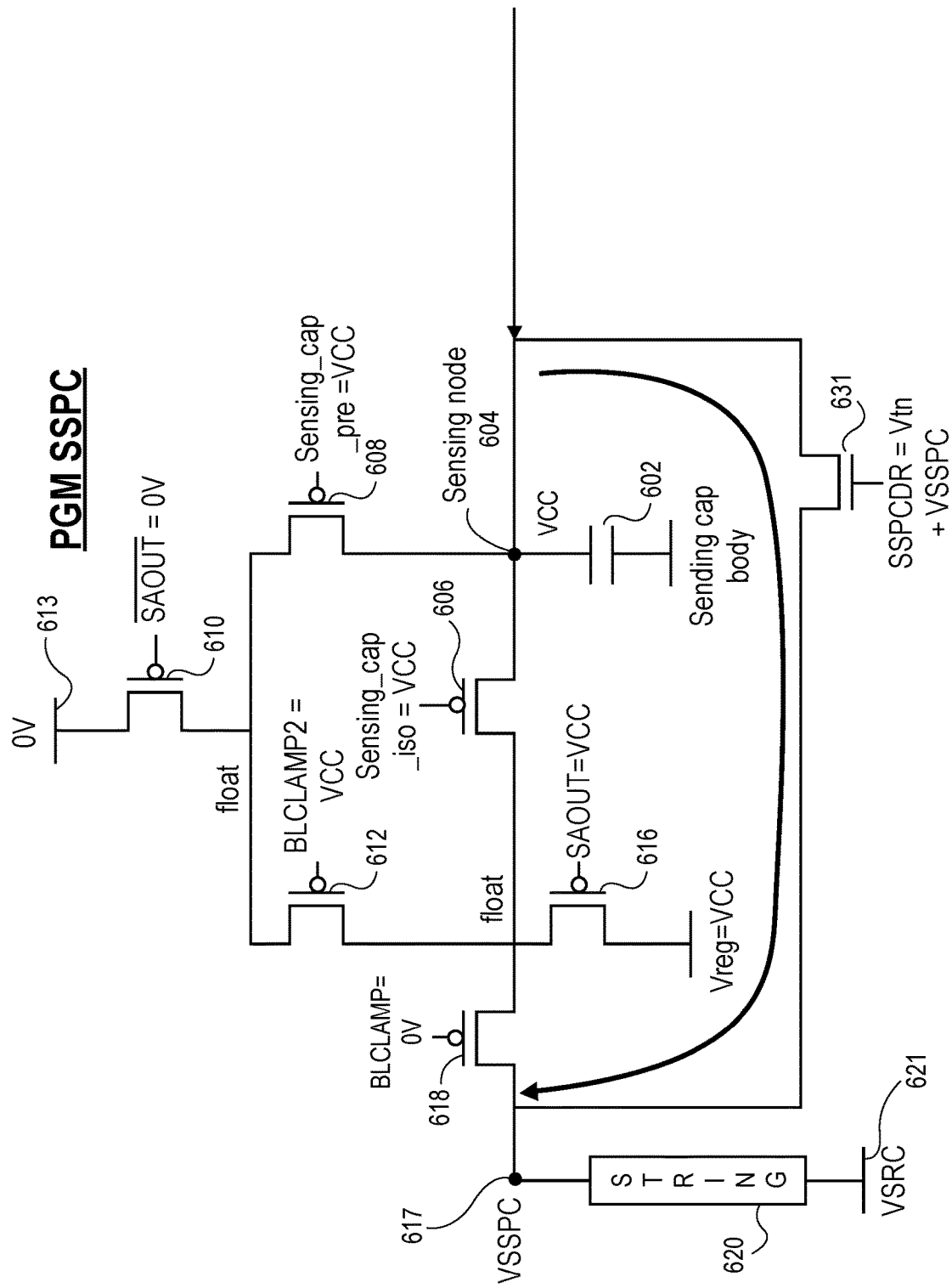
Figure 9C:
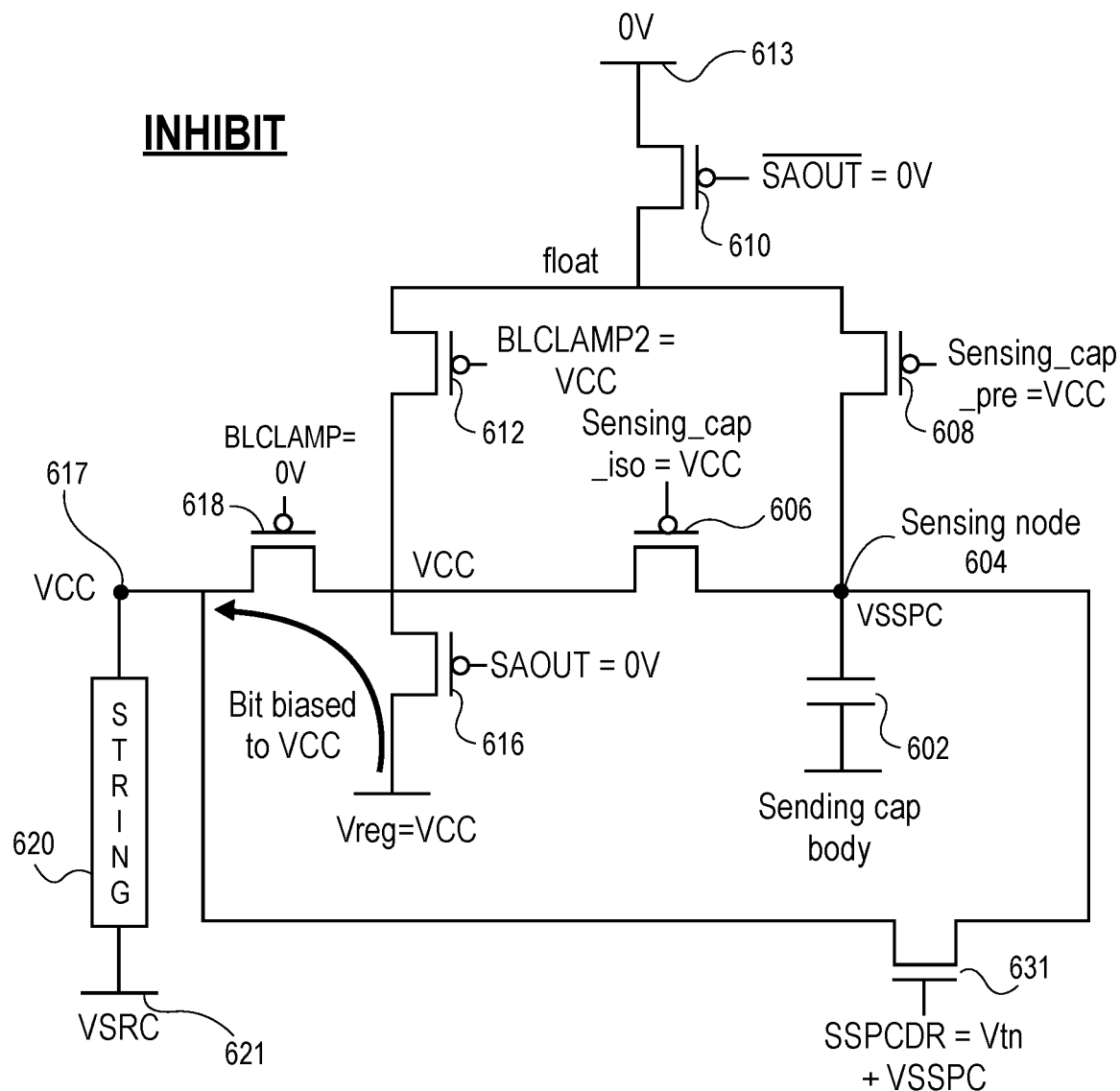

FIGS. 9A-9C illustrate examples of a reverse sensing circuit during program, program SSPC, and inhibit operations, respectively. The circuits shown in FIGS. 8A-8F can be the same as, or similar to, the circuit 600 of FIG. 6. As discussed above, an NMOS transistor is coupled across the PMOS transistors of the sensing circuit to provide a path to control the bitlines targeted for program, SSPC, and inhibit.

FIG. 9A shows the circuit 600 during a program operation. In the example illustrated in FIG. 9A, 0V is supplied to the bitline to perform the program operation. During programming, SAOUT is high (e.g., VCC) and the PMOS transistor 616 is turned off. In one example, 0V on the bitline is obtained by applying a voltage equal to Vtn+VSSPC (where Vtn is the threshold voltage of the SSPCDR transistor 631 and VSSPC is the voltage to apply to the bitline during an SSPC operation) to the gate of the SSPCDR transistor 631 and driving 0V at a driver node (e.g., the sensing node 604). The SSPCDR transistor 631 will thus act as a pass gate and will pass the 0V from the sensing node 604 to the bitline 617.

FIG. 9B shows the circuit 600 during an SSPC program operation. In the example illustrated in FIG. 9B, a voltage greater than 0V (VSSPC) is applied to the bitline to perform the SSPC program operation. During SSPC programming, SAOUT is high (e.g., VCC) and the PMOS transistor 616 is turned off. In one example, VSSPC is obtained on the bitline by applying a voltage equal to Vtn+VSSPC to the gate of the SSPCDR transistor 631 and the driving VCC at the sensing node 604. In this example, the SSPC NMOS transistor 631 throttles the bitline bias to VSSPC based on the voltage applied to the gate of the SSPC transistor 631. Thus, by applying VCC at the sensing node and controlling the gate voltage of the SSPC transistor 631, the target SSPC voltage can be obtained on the bitline 617.

FIG. 9C shows the circuit 600 during an inhibit operation. In this example, bitlines targeted for inhibit are biased to VCC via the Vreg, SAOUT, BLCLAMP path (e.g., via transistors 616 and 618). Therefore, in the illustrated example, the transistors 616 and 618 are turned on by applying 0V to the gates. The transistors 610, 612, 608, and 606 are turned off by applying VCC to the gates of those transistors, disabling those paths.

Thus, the reverse sensing circuit differs from a forward sensing circuit for program operations (e.g., regular program and SSPC program operations) and inhibit. For program operations, the bitlines are biased via the SSPCDR transistor 631. The sensing node 604 is driven to 0V for bitlines to be programmed and the SSPCDR transistor passes the voltage along to the bitline. The sensing node is driven to VCC for bitlines to receive the VSSPC bias. The SSPC NMOS transistor 631 throttles the bitline bias to VSSPC.

Figure 10:
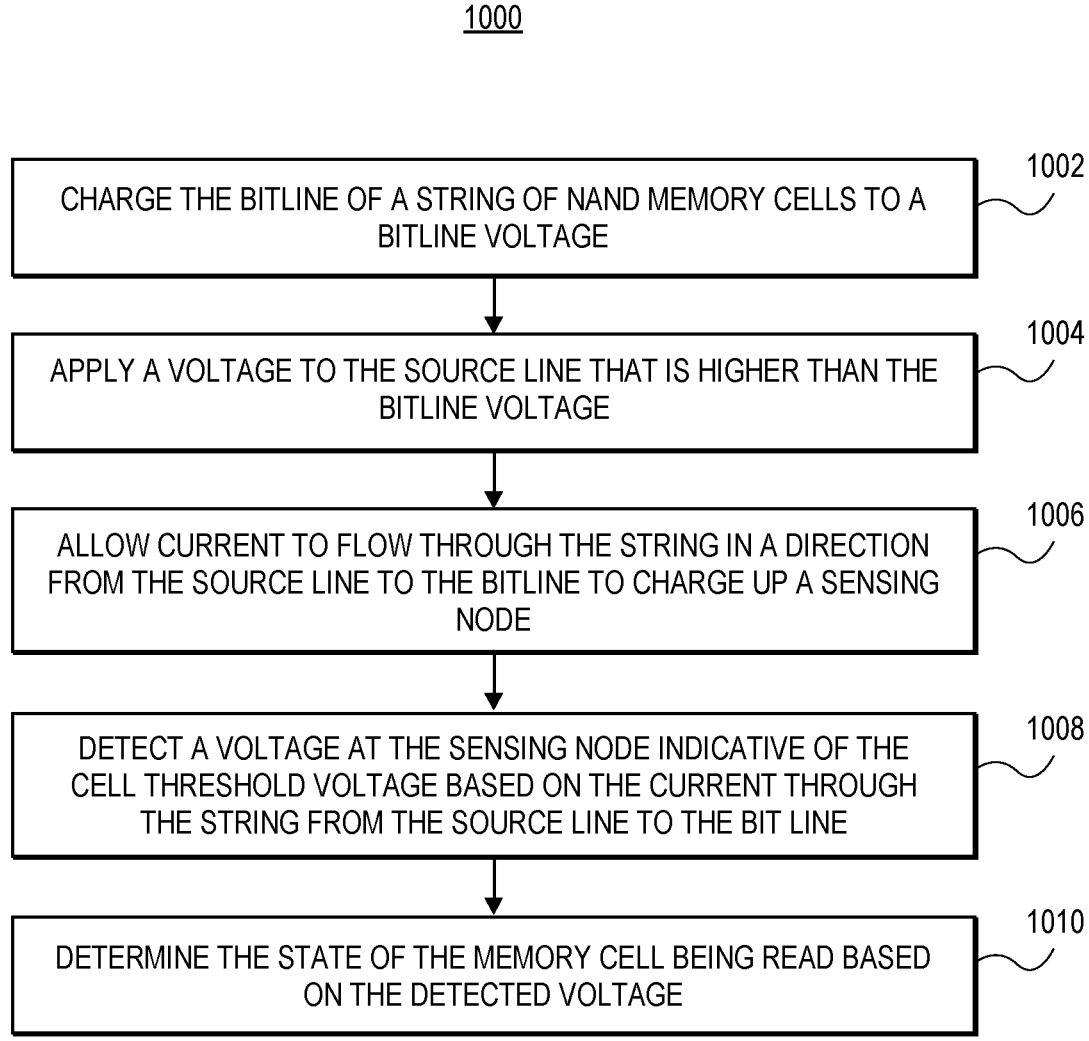
FIG. 10 is a flow diagram of an example of a method of sensing to decrease read disturb.

FIG. 10 is a flow diagram of an example of a method of sensing to decrease read disturb. The method 1000 of FIG. 10 may be performed by hardware (e.g., circuitry) or a combination of hardware and firmware. For example, the method 1000 may be performed by sense circuitry 134 of FIG. 1 or a combination of the sense circuitry 134 and the access circuitry 135. FIG. 6 illustrates one example of reverse sense circuitry 600 that may perform one or more aspects of the method 1000.

The method 1000 begins with charging a bitline (e.g., a selected bitline for reading) of a string of NAND memory cells to a bitline voltage, at 1002. For example, FIG. 8A illustrates an example of pre-charging a bitline 617 to a predetermined voltage Vpre, and FIG. 8B illustrates an example of bringing the bitline voltage from the pre-charge voltage Vpre to the initial target bitline voltage VBL. In the examples illustrated in FIGS. 8A and 8B, VBL is not equal to Vpre (e.g., VBL<Vpre), however, in other examples, the target bitline voltage may be the same as the precharge voltage. A source voltage is applied to the source line that is higher (e.g., more positive) than the bitline voltage, at 1004. For example, referring to FIG. 8B, VSRC is applied to the source line 621, where VSRC>VBL at the bitline.

Current is allowed to flow through the string in a direction from the source line to the bitline to charge up a sensing node, at 1006. For example, referring to FIG. 8D, transistors 618 and 606 between the bitline and the sensing node sense are enabled to allow sense current to flow from the source line 621 to the bitline 617 and to the sensing node 604. The current is allowed to flow from the source line to the bitline and to the sensing node for a predetermined time, which charges up the sensing node.

After the current flowing in the direction from the source line to the bitline has charged up the sensing node, a sense amplifier senses or detects the voltage at the sensing node, at 1008. For example, referring to FIG. 8E, the path from the bitline to the sensing node is disabled, and a sense amplifier senses the voltage at the sensing node 604. The voltage at the sensing node is based on the current that flowed through the string from the source line to the bitline, and is indicative of the target cell's threshold voltage. After detecting the voltage at the sensing node, the sensing operation is complete. Circuitry (e.g., sense and/or access circuitry) can then determine the state of the memory cell being read based on the detected voltage, at 1010.

Figure 11:
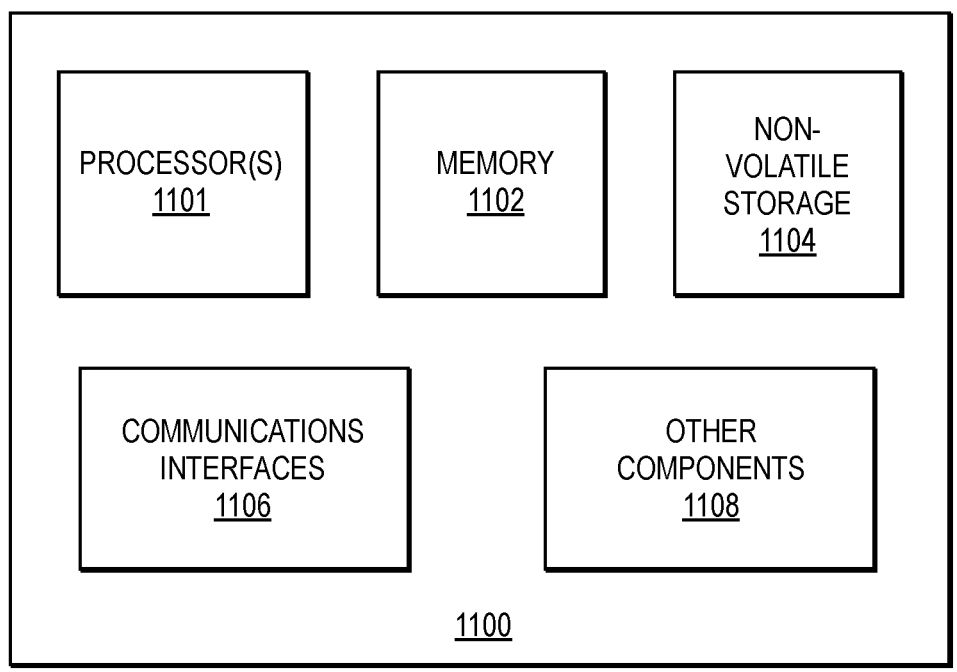
FIG. 11 provides an exemplary depiction of a computing system in which sensing and read mitigation techniques can be implemented.

FIG. 11 provides an exemplary depiction of a computing system 1100 (e.g., a smartphone, a tablet computer, a laptop computer, a desktop computer, a server computer, etc.). As observed in FIG. 11, the system 1100 may include one or more processors or processing units 1101. The processor(s) 1101 may include one or more central processing units (CPUs), each of which may include, e.g., a plurality of general-purpose processing cores. The processor(s) 1101 may also or alternatively include one or more graphics processing units (GPUs) or other processing units. The processor(s) 1101 may include memory management logic (e.g., a memory controller) and I/O control logic. The processor(s) 1101 can be similar to, or the same as, the processor 152 of FIG. 1.

The system 1100 also includes memory 1102 (e.g., system memory), non-volatile storage 1104, communications interfaces 1106, and other components 1108, which may also be similar to, or the same as, components of the host 150 of FIG. 1. The other components may include, for example, a display (e.g., touchscreen, flat-panel), a power supply (e.g., a battery or/or other power supply), sensors, power management logic, or other components. The communications interfaces 1106 may include logic and/or features to support a communication interface. For these examples, communications interface 1106 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more standards promulgated by IEEE. For example, one such Ethernet standard may include IEEE 802.3. Network communication may also occur according to one or more OpenFlow specifications such as the OpenFlow Switch Specification. Other examples of communications interfaces includes, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 1104, which may be the mass storage component of the system. The non-volatile storage 1104 can be similar to, or the same as, the NVM device 120 of FIG. 1, described above. The non-volatile storage 1104 can include a solid state drive (SSD), a dual in-line memory module (DIMM), or other non-volatile storage. Non-volatile types of memory may include non-volatile memory such as, but not limited to, multi-threshold level NAND flash memory (e.g., 3D NAND flash memory). In one example, the non-volatile storage 1104 may include mass storage that is composed of one or more SSDs. SSDs can be composed of flash memory chips that are capable of implementing the sensing and read disturb mitigation techniques described above.

Examples of Sensing circuits and techniques for NAND memory follow.

Example 1: A NAND storage device includes a storage array including a string of NAND memory cells coupled with a source line, and circuitry coupled with a bitline of the string of NAND memory cells to perform a sensing operation. The circuitry is to: charge the bitline of the string of NAND memory cells to a bitline voltage, apply a voltage to the source line that is higher than the bitline voltage, and detect a voltage at a gate of a PMOS transistor at a sensing node indicative of a threshold voltage of a memory cell based on current through the string from the source line to the bitline.

Example 2: The NAND storage device of example 1, wherein the PMOS transistor is to operate in accumulation mode.

Example 3: The NAND storage device of example 1 or 2, wherein the circuitry is to: enable a path between the bitline and the sensing node for current supplied to the bitline from the source line for a predetermined time, and detect the voltage at the sensing node after the predetermined time.

Example 4: The NAND storage device of any of examples 1-3, wherein the circuitry to perform the sensing operation includes PMOS transistors.

Example 5: The NAND storage device of any of examples 1-4, further including an NMOS transistor between the bitline and the sensing node to bypass the circuitry to perform the sensing operation and supply a bitline voltage to perform a program operation.

Example 6: The NAND storage device of any of examples 1-5, wherein the circuitry is to: precharge the sensing node to a precharge voltage, and prior to detection of the voltage at the sensing node, decrease the voltage of the sensing node to be lower than the precharge voltage.

Example 7: The NAND storage device of any of examples 1-6, wherein the circuitry is to: prior to detection of the voltage at the sensing node, turn on a PMOS transistor between the bitline and the sensing node to enable current to flow from the string to the sensing node for a predetermined time.

Example 8. A system including a processor and a NAND storage device coupled with the processor, wherein the NAND storage device is in accordance with any of examples 1-7.

Example 9: A solid state drive (SSD) including input/output (I/O) interface circuitry to couple with a host, the I/O interface circuitry to receive a read request, and one or more dies, each of the one or more dies including: a storage array including a string of NAND memory cells coupled with a source line, and circuitry coupled with a bitline of the string of NAND memory cells to perform a sensing operation in response to the read request. The circuitry is to charge the bitline of the string of NAND memory cells to a bitline voltage, apply a voltage to the source line that is higher than the bitline voltage, and detect a voltage at a gate of a PMOS transistor at a sensing node indicative of a threshold voltage of a memory cell based on current through the string from the source line to the bitline.

Example 10: the SSD of example 9 in accordance with any of examples 1-7.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A NAND storage device comprising:
   a storage array including a string of NAND memory cells coupled with a source line; and
   circuitry coupled with a bitline of the string of NAND memory cells to perform a sensing operation, the circuitry to:
      charge the bitline of the string of NAND memory cells to a bitline voltage,
      apply a first voltage to the source line that is higher than the bitline voltage,
      enable a path between the bitline and a sensing node for current supplied to the bitline from the source line for a predetermined time, and
      detect, after the predetermined time, a second voltage at a gate of a PMOS transistor at the sensing node, wherein the second voltage is indicative of a threshold voltage of a memory cell based on the current through the string from the source line to the bitline, and wherein the PMOS transistor is to operate in accumulation mode.

2. The NAND storage device of claim 1, wherein:
   the circuitry to perform the sensing operation includes PMOS transistors.

3. The NAND storage device of claim 2, wherein the bitline voltage is a first bitline voltage, and wherein the NAND storage device further comprises:
   an NMOS transistor between the bitline and the sensing node to bypass the circuitry to perform the sensing operation and supply a second bitline voltage to perform a program operation.

4. The NAND storage device of claim 1, wherein:
   the circuitry is to:
      precharge the sensing node to a precharge voltage, and
      prior to detection of the second voltage at the sensing node, cause a voltage decrease at the sensing node.

5. The NAND storage device of claim 4, wherein:
   after the voltage decrease, the sensing node is to be at a lower voltage than the precharge voltage.

6. The NAND storage device of claim 4, wherein:
   the circuitry is to:
      after the detection of the second voltage, cause a voltage increase at the sensing node.

7. The NAND storage device of claim 6, wherein:
   the circuitry is to:
      after the voltage increase, detect a third voltage at the sensing node.

8. The NAND storage device of claim 1, wherein:
the PMOS transistor is a first PMOS transistor, and
the circuitry is to:
prior to detection of the second voltage at the sensing node:
turn on a second PMOS transistor between the bitline and the sensing node to enable the current to flow from the string to the sensing node for the predetermined time.

9. A system comprising:
a processor; and
a NAND storage device coupled with the processor, the NAND storage device including:
a storage array including a string of NAND memory cells coupled with a source line; and
circuitry coupled with a bitline of the string of NAND memory cells to perform a sensing operation, the circuitry to:
charge the bitline of the string of NAND memory cells to a bitline voltage,
apply a first voltage to the source line that is higher than the bitline voltage,
enable a path between the bitline and a sensing node for current supplied to the bitline from the source line for a predetermined time, and
detect, after the predetermined time, a second voltage at a gate of a PMOS transistor at the sensing node, wherein the second voltage is indicative of a threshold voltage of a memory cell based on the current through the string from the source line to the bitline, and wherein the PMOS transistor is to operate in accumulation mode.

10. The system of claim 9, wherein:
the circuitry to perform the sensing operation includes PMOS transistors.

11. The system of claim 10, wherein the bitline voltage is a first bitline voltage, and wherein the system further comprises:
an NMOS transistor between the bitline and the sensing node to bypass the circuitry to perform the sensing operation and supply a second bitline voltage to perform a program operation.

12. The system of claim 9, wherein:
the circuitry is to:
precharge the sensing node to a precharge voltage, and
prior to detection of the second voltage at the sensing node, cause a voltage decrease at the sensing node.

13. The system of claim 12, wherein:
the circuitry is to:
after the detection of the second voltage, cause a voltage increase at the sensing node.

14. The system of claim 13, wherein:
the circuitry is to:
after the voltage increase, detect a third voltage at the sensing node.

15. The system of claim 9, wherein:
the PMOS transistor is a first PMOS transistor, and
the circuitry is to:
prior to detection of the second voltage at the sensing node:
turn on a second PMOS transistor between the bitline and the sensing node to enable the current to flow from the string to the sensing node for the predetermined time.

16. A solid state drive (SSD) comprising:
input/output (I/O) interface circuitry to couple with a host, the I/O interface circuitry to receive a read request; and
one or more dies, each of the one or more dies including:
a storage array including a string of NAND memory cells coupled with a source line; and
circuitry coupled with a bitline of the string of NAND memory cells to perform a sensing operation in response to the read request, the circuitry to:
charge the bitline of the string of NAND memory cells to a bitline voltage,
apply a first voltage to the source line that is higher than the bitline voltage,
enable a path between the bitline and a sensing node for current supplied to the bitline from the source line for a predetermined time, and
detect, after the predetermined time, a second voltage at a gate of a PMOS transistor at the sensing node, wherein the second voltage is indicative of a threshold voltage of a memory cell based on the current through the string from the source line to the bitline, and wherein the PMOS transistor is to operate in accumulation mode.

17. The SSD of claim 16, wherein:
the circuitry to perform the sensing operation includes PMOS transistors.

18. The SSD of claim 16, wherein the bitline voltage is a first bitline voltage, and wherein the SSD further comprises:
an NMOS transistor between the bitline and the sensing node to bypass the circuitry to perform the sensing operation and supply a second bitline voltage to perform a program operation.

19. The SSD of claim 16, wherein:
the circuitry is to:
precharge the sensing node to a precharge voltage, and
prior to detection of the second voltage at the sensing node, cause a voltage decrease at the sensing node.

20. The SSD of claim 19, wherein:
the circuitry is to:
after the detection of the second voltage, cause a voltage increase at the sensing node.

* * * * *